United States Patent
Ogata et al.

(10) Patent No.: US 11,067,973 B2
(45) Date of Patent: Jul. 20, 2021

(54) DATA COLLECTION SYSTEM, ABNORMALITY DETECTION METHOD, AND GATEWAY DEVICE

(71) Applicant: HITACHI, LTD., Tokyo (JP)

(72) Inventors: Yuji Ogata, Tokyo (JP); Daisuke Ishii, Tokyo (JP)

(73) Assignee: HITACHI, LTD., Tokyo (JP)

( * ) Notice: Subject to any disclaimer, the term of this patent is extended or adjusted under 35 U.S.C. 154(b) by 210 days.

(21) Appl. No.: 16/332,275

(22) PCT Filed: Nov. 30, 2016

(86) PCT No.: PCT/JP2016/085480
§ 371 (c)(1),
(2) Date: Mar. 11, 2019

(87) PCT Pub. No.: WO2018/100655
PCT Pub. Date: Jun. 7, 2018

(65) Prior Publication Data
US 2019/0204818 A1 Jul. 4, 2019

(51) Int. Cl.
*G05B 23/00* (2006.01)
*G05B 23/02* (2006.01)
(Continued)

(52) U.S. Cl.
CPC ......... *G05B 23/0221* (2013.01); *G01R 23/00* (2013.01); *G05B 23/0243* (2013.01);
(Continued)

(58) Field of Classification Search
CPC ............ G05B 23/0221; G05B 23/0283; G05B 23/0243; G05B 23/0262; G05B 23/0267;
(Continued)

(56) References Cited

U.S. PATENT DOCUMENTS

2003/0061008 A1* 3/2003 Smith, Jr. .......... G05B 23/0283
702/188
2007/0067678 A1* 3/2007 Hosek ...................... G07C 3/00
714/25
(Continued)

FOREIGN PATENT DOCUMENTS

JP      11-083618 A     3/1999
JP      2005-215833 A     8/2005
(Continued)

OTHER PUBLICATIONS

Betta, Giovanni, et al. "A DSP-based FFT-analyzer for the fault diagnosis of rotating machine based on vibration analysis." IEEE Transactions on Instrumentation and Measurement 51.6 (2002): 1316-1322. (Year: 2002).*

(Continued)

*Primary Examiner* — Michael D Masinick
(74) *Attorney, Agent, or Firm* — Volpe Koenig

(57) ABSTRACT

A data collection system pertaining to one embodiment of the present invention collects time-series data which is output from sensors installed on equipment which is a monitored object and carries out detecting an abnormality of the equipment. The data collection system stores plural fault models as data for comparison with time-series data and, in a learning process, determines a range to examine within time-series data by comparing the time-series data with each one of the fault models. An abnormality detection process includes extracting a partial frequency spectrum to examine from the frequency spectrum of time-series data, using information on the range to examine within the time-series data determined through the learning process, and carrying out detecting an abnormality of the equipment using the extracted frequency spectrum.

9 Claims, 20 Drawing Sheets

| SENSOR | LEARNING OPERATING STATE | MEDIAN | LOWER LIMIT | UPPER LIMIT | SHIFT VELOCITY | SAMPLING FREQUENCY | SAMPLING PERIOD | FFT LENGTH |
|---|---|---|---|---|---|---|---|---|
| 1401 | 1402 | 1403 | 1404 | 1405 | 1406 | 1407 | 1408 | 1409 |
| SENSOR#1 | OPERATING | 10kHz | 8kHz | 12kHz | fv1/s | 100kHz | 10us | 2^17 |
| SENSOR#2 | NON-OPERATING | NONE | NONE | NONE | NONE | 100kHz | 10us | 2^17 |
| SENSOR#3 | OPERATING | 10kHz | 8kHz | 12kHz | fv3/s | 100kHz | 10us | 2^17 |
| ... | ... | ... | ... | ... | ... | ... | ... | ... |

LEARNING INFORMATIONRMATION MANAGEMENT TABLE 1400

(51) Int. Cl.
G01R 23/00 (2006.01)
G06N 3/00 (2006.01)
G06N 5/00 (2006.01)

(52) U.S. Cl.
CPC ..... *G05B 23/0262* (2013.01); *G05B 23/0267* (2013.01); *G05B 23/0283* (2013.01); *G06N 3/008* (2013.01); *G05B 23/0235* (2013.01); *G06N 5/00* (2013.01)

(58) Field of Classification Search
CPC ...... G05B 23/0235; G06N 3/008; G06N 5/00; G01R 23/00
See application file for complete search history.

(56) References Cited

U.S. PATENT DOCUMENTS

2012/0101622 A1* 4/2012 Yun .................... H01J 37/3299
700/110
2018/0217812 A1* 8/2018 Nakamura ............ G06F 16/903

FOREIGN PATENT DOCUMENTS

JP 2006-113002 A 4/2006
WO 2011/036809 A1 3/2011

OTHER PUBLICATIONS

International Search Report dated Jan. 24, 2017 for the PCT International Application No. PCTJP2016/085480.

* cited by examiner

FIG.6

| TIME STAMP | SENSOR #1 | SENSOR #2 | ... | SENSOR #n |
|---|---|---|---|---|
| t0 | v10 | v20 | ... | vn0 |
| t1 | v11 | v21 | ... | vn1 |
| t2 | v12 | v23 | ... | vn2 |
| ... | ... | ... | ... | ... |
| tm | v1m | v2m | ... | vnm |

SENSOR DATA TABLE 600

FIG.7

| TIME INSTANT | MEDIAN | LOWER LIMIT | UPPER LIMIT | DATA SEQUENCE (FREQUENCY, VIBRATION INTENSITY) |
|---|---|---|---|---|
| tf0 | fc_0 | f1_0 | f2_0 | (.., ..), (.., ..),... |
| tf1 | fc_1 | f1_1 | f2_1 | (.., ..), (.., ..),... |
| tf2 | fc_2 | f1_2 | f2_2 | (.., ..), (.., ..),... |
| ... | ... | ... | ... | ... |
| tfm | fc_m | f1_m | f2_m | (.., ..), (.., ..),... |

701 702 703 704 705

FREQUENCY ANALYSIS DATA TABLE 700

FIG.8

| SENSOR | SAMPLING FREQUENCY | SAMPLING PERIOD | FFT LENGTH |
|---|---|---|---|
| SENSOR #1 | 100kHz | 10us | 2^17 |
| SENSOR #2 | 100kHz | 10us | 2^17 |
| SENSOR #3 | 100kHz | 10us | 2^17 |
| ... | ... | ... | ... |
| SENSOR #n | 100kHz | 10us | 2^17 |

FREQUENCY ANALYSIS PARAMETER TABLE 800

FIG.9

| FAULT MODEL | SIMILARITY RATIO | RESEMBLANCE CANDIDATE |
|---|---|---|
| FAULT MODEL 1 | 0.79 | ○ |
| FAULT MODEL 2 | 0.53 | × |
| FAULT MODEL 3 | 0.71 | ○ |
| ... | ... | ... |
| FAULT MODEL n | 0.48 | × |

SIMILARITY MANAGEMENT TABLE 900

FIG.10

| SENSOR | LEARNING PERIOD | LEARNING START TIME | LEARNING END TIME |
|---|---|---|---|
| SENSOR#1 | ONE DAY | 2016/06/22 08:30:15 | 2016/06/23 08:30:14 |
| SENSOR#2 | ONE DAY | NONE | NONE |
| SENSOR#3 | ONE DAY | 2016/06/22 08:30:20 | 2016/06/23 08:30:19 |
| ... | ... | ... | ... |
| SENSOR#n | ONE DAY | 2016/06/22 08:30:25 | 2016/06/23 08:30:24 |

NUMBER OF LEARNING OPERATIONS
MANAGEMENT TABLE 1000

FIG.11
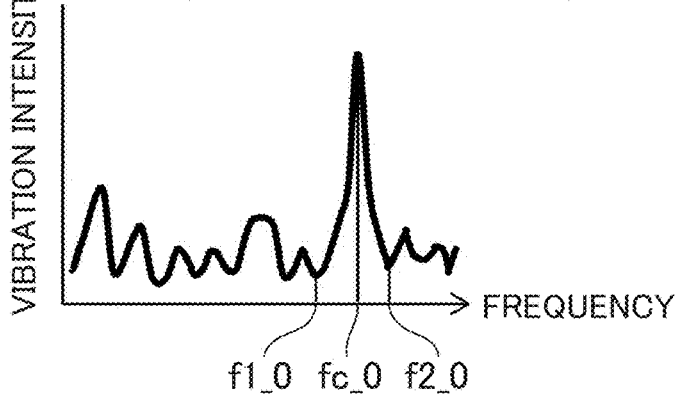
1101 WAVEFORM OF SENSOR DATA OF FAULT MODEL 1 AT TIME INSTANT tf0
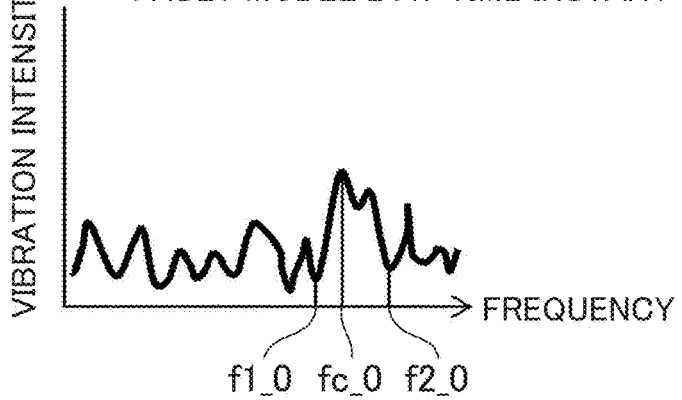
1102 WAVEFORM OF SENSOR DATA OF FAULT MODEL 2 AT TIME INSTANT tf0
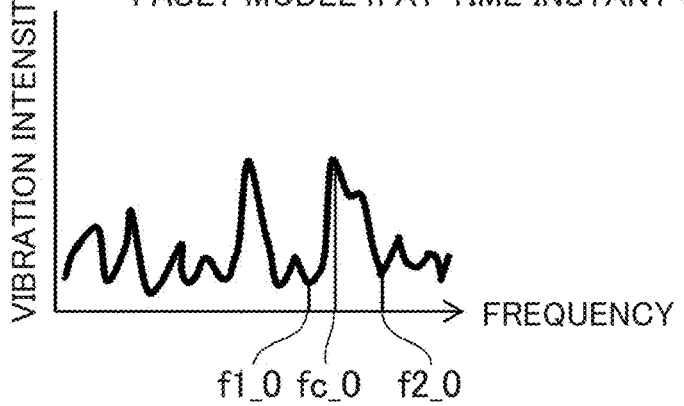
1103 WAVEFORM OF SENSOR DATA OF FAULT MODEL n AT TIME INSTANT tf0

FIG.14

| 1401 | 1402 | 1403 | 1404 | 1405 | 1406 | 1407 | 1408 | 1409 |
|---|---|---|---|---|---|---|---|---|
| SENSOR | LEARNING OPERATING STATE | MEDIAN | LOWER LIMIT | UPPER LIMIT | SHIFT VELOCITY | SAMPLING FREQUENCY | SAMPLING PERIOD | FFT LENGTH |
| SENSOR#1 | OPERATING | 10kHz | 8kHz | 12kHz | fv1/s | 100kHz | 10us | 2^17 |
| SENSOR#2 | NON-OPERATING | NONE | NONE | NONE | NONE | 100kHz | 10us | 2^17 |
| SENSOR#3 | OPERATING | 10kHz | 8kHz | 12kHz | fv3/s | 100kHz | 10us | 2^17 |
| ... | ... | ... | ... | ... | ... | ... | ... | ... |

LEARNING INFORMATIONRMATION MANAGEMENT TABLE 1400

FIG.16

| 1601 | 1602 | 1603 | 1604 | 1605 | 1606 | 1607 | 1608 | 1609 | 1610 | 1611 |
|---|---|---|---|---|---|---|---|---|---|---|
| SENSOR | LEARNING OPERATING STATE | MEDIAN | LOWER LIMIT | UPPER LIMIT | SHIFT VELOCITY | CURRENT VALUE OF SHIFT VELOCITY | SAMPLING FREQUENCY | SAMPLING PERIOD | FFT LENGTH | SENSOR DATA TRANSMISSION |
| SENSOR#1 | OPERATING | 10kHz | 8kHz | 12kHz | fv1/s | NONE | 100kHz | 10us | 2^17 | NOT TRANSMIT |
| SENSOR#2 | NON-OPERATING | NONE | NONE | NONE | NONE | NONE | NONE | NONE | NONE | TRANSMIT |
| ... | ... | ... | ... | ... | ... | ... | ... | ... | ... | ... |

1621  1622

GW LEARNING INFORMATION MANAGEMENT TABLE 1600

FIG.17

| 1701 | 1702 | 1703 | 1704 | 1705 | 1706 | 1707 | 1708 | 1709 | 1710 | 1711 |
|---|---|---|---|---|---|---|---|---|---|---|
| SENSOR | LEARNING OPERATING STATE | MEDIAN | LOWER LIMIT | UPPER LIMIT | SHIFT VELOCITY | CURRENT VALUE OF SHIFT VELOCITY | SAMPLING FREQUENCY | SAMPLING PERIOD | FFT LENGTH | SENSOR DATA TRANSMISSION |
| SENSOR#1 | OPERATING | 9.9kHz | 7.8kHz | 11.9kHz | fv1/s | -100Hz/s | 100kHz | 10us | 2^17 | NOT TRANSMIT |
| SENSOR#2 | NON-OPERATING | NONE | NONE | NONE | NONE | NONE | NONE | NONE | NONE | TRANSMIT |
| ... | ... | ... | ... | ... | ... | ... | ... | ... | ... | ... |

GW LEARNING INFOORMATIONRMATION MANAGEMENT TABLE 1700

FIG.18

| 1801 | 1802 | 1803 | 1804 | 1805 | 1806 | 1807 | 1808 | 1809 | 1810 | 1811 |
|---|---|---|---|---|---|---|---|---|---|---|
| SENSOR | LEARNING OPERATING STATE | MEDIAN | LOWER LIMIT | UPPER LIMIT | SHIFT VELOCITY | CURRENT VALUE OF SHIFT VELOCITY | SAMPLING FREQUENCY | SAMPLING PERIOD | FFT LENGTH | SENSOR DATA TRANSMISSION |
| SENSOR#1 | OPERATING | 9.7kHz | 7.6kHz | 11.7kHz | fv1/s | -200Hz/s | 100kHz | 10us | 2^17 | NOT TRANSMIT |
| SENSOR#2 | NON-OPERATING | NONE | NONE | NONE | NONE | NONE | NONE | NONE | NONE | TRANSMIT |
| ... | ... | ... | ... | ... | ... | ... | ... | ... | ... | ... |

GW LEARNING INFORMATION MANAGEMENT TABLE 1800

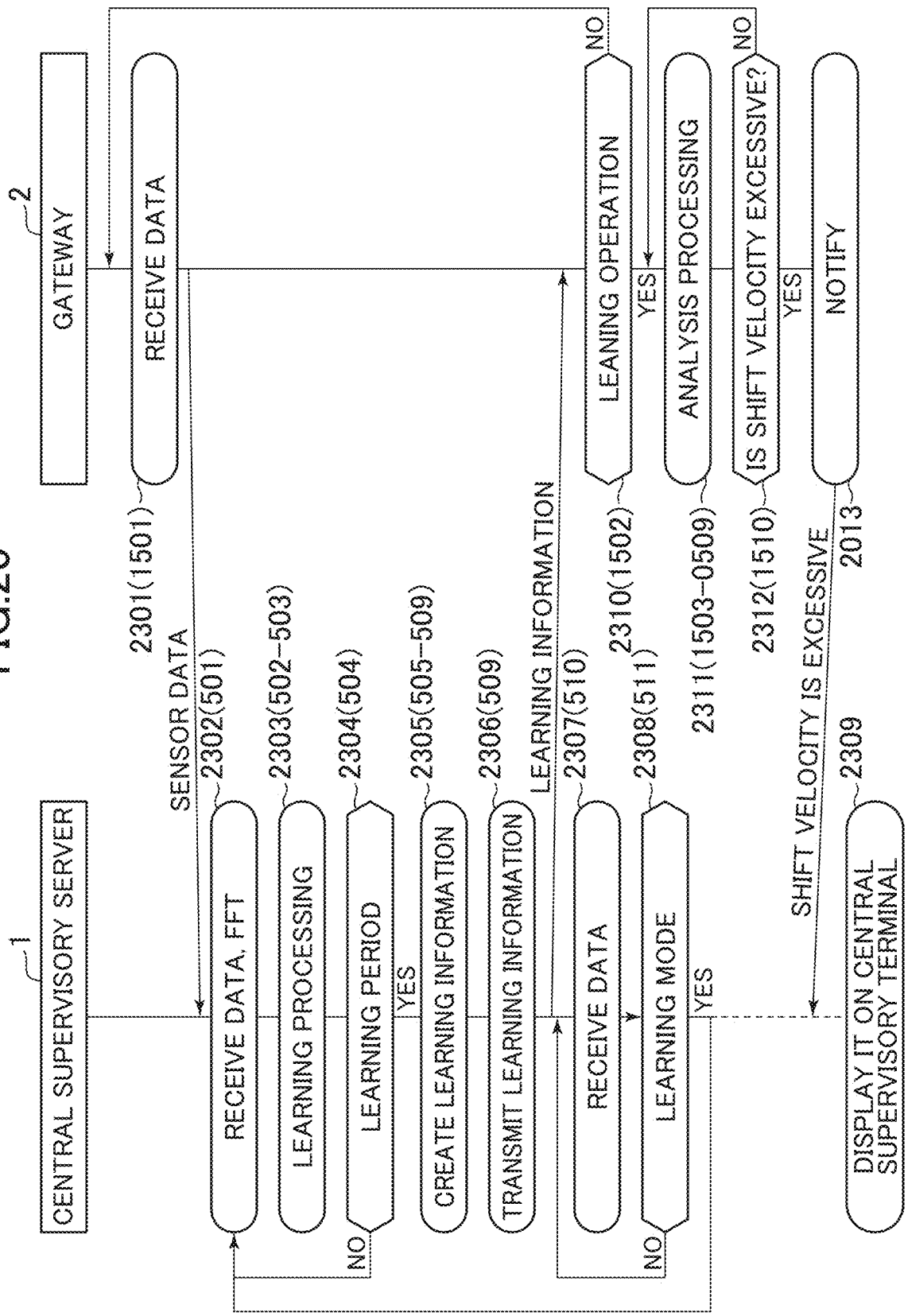

DATA COLLECTION SYSTEM, ABNORMALITY DETECTION METHOD, AND GATEWAY DEVICE

TECHNICAL FIELD

The present invention relates to a technology that collects and processes data acquired from sensors.

BACKGROUND ART

In plants and industrial facilities, a large number of sensors are installed on machinery and equipment and the like and a technology in which data from the sensors is collected by a computer and the computer performs diagnosis on the machinery and equipment is used.

For example, Patent Literature 1 discloses an abnormality diagnosis system in which sound or vibration generated from machinery and equipment is detected by sensors and, by analyzing sensor detection signals, diagnosis is performed for an abnormality of bearings or bearing-related members within the machinery and equipment. This abnormality diagnosis system includes an envelope processing unit which obtains an envelope of a detection signal, an FFT unit which transforms the envelope obtained by the envelope processing unit to a frequency spectrum, a peak detection unit that performs moving average and smoothing of the frequency spectrum obtained by the FFT unit and detects a spectral peak, and a diagnosis unit that diagnoses an abnormality based on the frequency spectral peak detected by the peak detection unit.

CITATION LIST

Patent Literature

Patent Literature 1: Japanese Unexamined Patent Application Publication No. 2006-113002

SUMMARY OF INVENTION

Technical Problem

In the diagnosis system on machinery and equipment, there is a huge amount of sensor data generated from each component unit of equipment, and the system that performs abnormality detection from such a huge amount of data encounters a problem in which, inter alia, processing cost and storage cost become expensive. In the technology disclosed in Patent Literature 1, because data in an entire range of frequencies is collected and processed, it is difficult to keep data processing cost low.

Solution to Problem

A data collection system pertaining to one embodiment of the present invention collects time-series data which is output from sensors installed on equipment which is a monitored object and carries out detecting an abnormality of the equipment. The data collection system stores plural fault models as data for comparison with time-series data and, in a learning process, determines a range to examine within time-series data by comparing the time-series data with each one of the fault models. An abnormality detection process includes extracting a partial frequency spectrum to examine from the frequency spectrum of time-series data, using information on the range to examine within the time-series data determined through the learning process, and carrying out detecting an abnormality of the equipment using the extracted frequency spectrum.

Advantageous Effects of Invention

A data collection system pertaining to one embodiment of the present invention carries out detecting an abnormality of equipment, using only information obtained from within a partial range of a frequency spectrum of time-series data collected from sensors; therefore, it is possible to prevent increasing in processing cost.

BRIEF DESCRIPTION OF DRAWINGS

FIG. 6 is a diagram depicting one example of a sensor data table.

FIG. 7 is a diagram depicting one example of a frequency analysis data table.

FIG. 8 is a diagram depicting one example of a frequency analysis parameter table.

FIG. 9 is a diagram depicting one example of a similarity management table.

FIG. 10 is a diagram depicting one example of a number-of-learning-operations management table.

FIG. 11 is a diagram depicting examples of waveforms of fault models.

FIG. 14 is a diagram depicting one example of a learning information management table.

FIG. 16 is a diagram depicting one example of a GW learning information management table.

FIG. 17 is a diagram depicting an example of the GW learning information management table updated by the learning information selecting unit.

FIG. 18 is a diagram depicting an example of the GW learning information management table updated by the learning information selecting unit.

FIG. 20 is a diagram depicting one example of processing flows that are performed by the central facility server and the gateway.

DESCRIPTION OF EMBODIMENTS

In the following, an embodiment of the present invention will be described based on the accompanying drawings.

Embodiment

Figure 1:
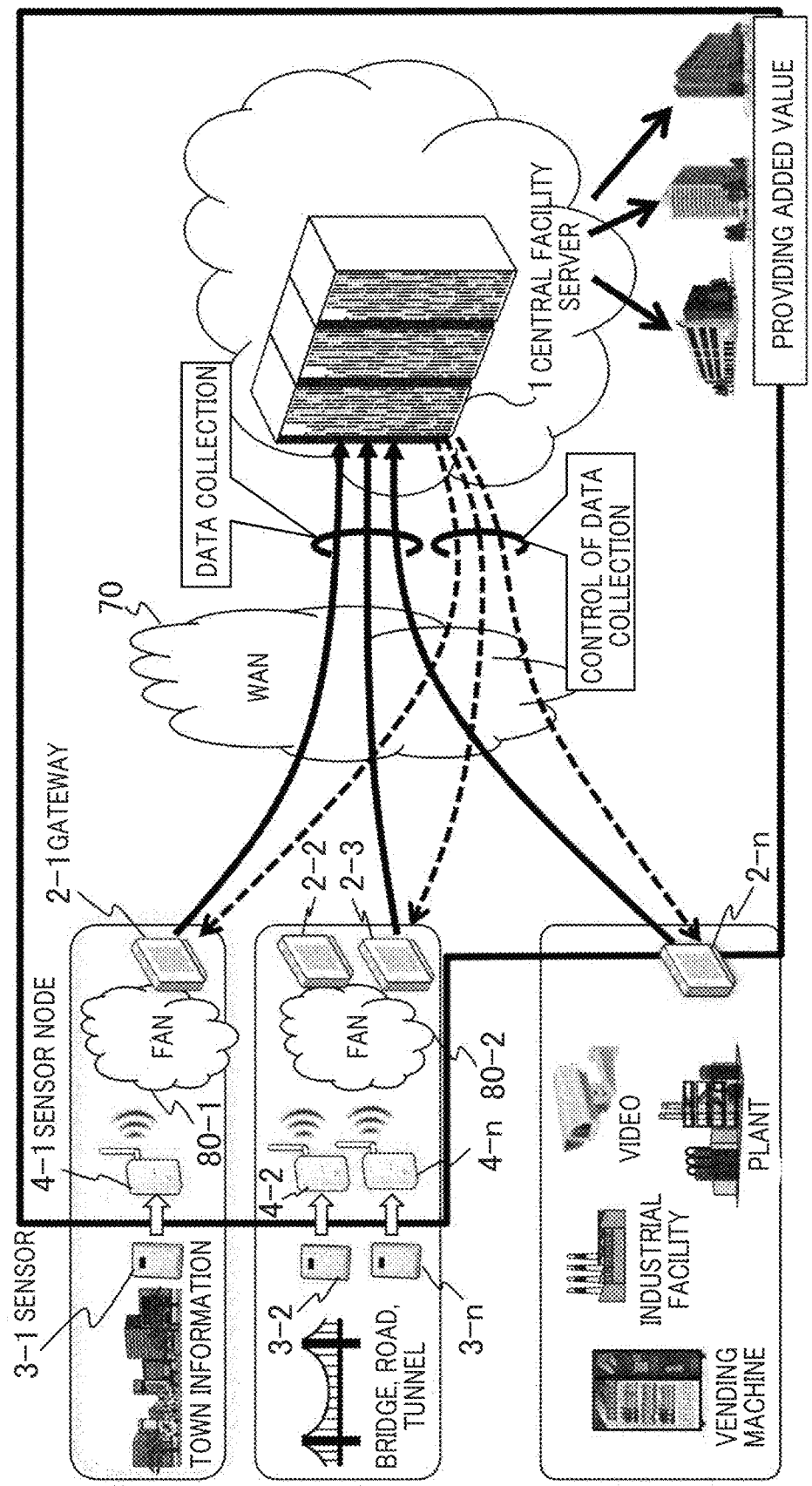
FIG. 1 is a block diagram depicting an overview of a data collection system.

FIG. 1 is a block diagram depicting an overview of a data collection system pertaining to one embodiment of the present invention. In the data collection system, plural sensors 3-1 to 3-$n$ to measure a physical quantity, such as vibration and temperature, are installed on machines, equipment, and structures which are assumed as monitored objects. Data measured by the sensors 3-1 to 3-$n$ is transmitted from gateways 2-1 to 2-$n$ via a network (Wide Area Network (WAN) 70 to a central facility server 1 (which may be abbreviated to "server 1"). Now, when referring to the sensors 3-1 to 3-$n$ as a whole, they are denoted by reference numeral "3" without a suffix after a hyphen "-" and, when identifying an individual sensor, the reference numeral with a suffix added after a hyphen "-" is used. The same is true for the reference numerals of other components hereinafter.

In FIG. 1, a sensor node (a wireless communication unit) 4-1 connected with a sensor 3-1 is connected to a gateway 2-1 via FAN (Field Area Network) 80-1 which is a wireless communication network. Now, a network which connects a sensor 3 with a sensor node 4 is not limited to the wireless communication network and both may be connected via a wired communication network. Now, a gateway 2 is a relay device which relays communication between different networks and, for example, can be configured using a router or the like. In addition, the FAN 80 is not limited to the wireless communication network and may be one of networks including a wired communication network. Now, the number of sensors 3 which are connected to a sensor node 4 and the number of sensor nodes which are connected to a gateway 2 are not limited to the number of pieces depicted in FIG. 1 and can be varied. For example, plural sensor nodes 4 may be connected to one gateway 2. Or, plural sensors 3 may be connected to a sensor node 4.

In addition, association between a gateway 2 and sensor nodes 4 is set beforehand and the gateway 2 communicates with one of its associated sensor nodes 4.

One or plural sensors 3 are deployed on one monitored object and at least one gateway 2 is installed for each monitored object. A gateway 2 forwards time-series data (hereinafter referred to as sensor data) of measurement values collected from the sensors 3 to the central facility server 1 via a WAN 70. Now, plural monitored objects may exist in the coverage of a gateway 2.

In addition to collecting sensor data, the gateway 2 carries out detecting an abnormality of a monitored object by analyzing the sensor data. Also, the gateway 2 monitors the states of its associated sensors 3 and controls the sensors. In the example of FIG. 1, the example in which a sensor 3 is associated with and connected to a gateway 2 via a sensor node 4 is presented; no limitation to this is intended. For instance, if there are a large number of sensors 3 or if equipment or a facility included in a range of monitored objects is far away, a configuration in which plural gateways 2 are connected hierarchically may be adopted.

The central facility server 1 performs learning processing to specify a frequency range (sensing range) within which a gateway 2 is to carry out detecting an abnormality of a monitored object, based on sensor data received from the gateway 2 and notifies the gateway 2 of a result of the learning processing. The central facility server 1 also performs processing of information with the addition of added values, such as monitoring of monitored objects, visualizing sensor data, analyzing sensor data, or predicting failure of a monitored object and provides such information to a customer, such as a user who is responsible for maintenance of monitored objects. However, in the following description of the present invention, descriptions about processing including monitoring of monitored objects, visualizing sensor data, etc. which is performed in the central facility server 1 are omitted. The following description focuses on processing with regard to a method of detecting an abnormality in a facility, which is a characteristic functionality intrinsic to the data collection system pertaining to the present embodiment.

As monitored objects in the data collection system pertaining to the present embodiment, plants, industrial facilities, and machines such as transportation equipment and vending machines are to be monitored; additionally, building structures such as bridges, roads, and tunnels can be assumed as monitored objects. Monitored objects in the data collection system go beyond machines and building structures; video, city/town environment (town information), and others can be assumed as monitored objects.

Figure 2:
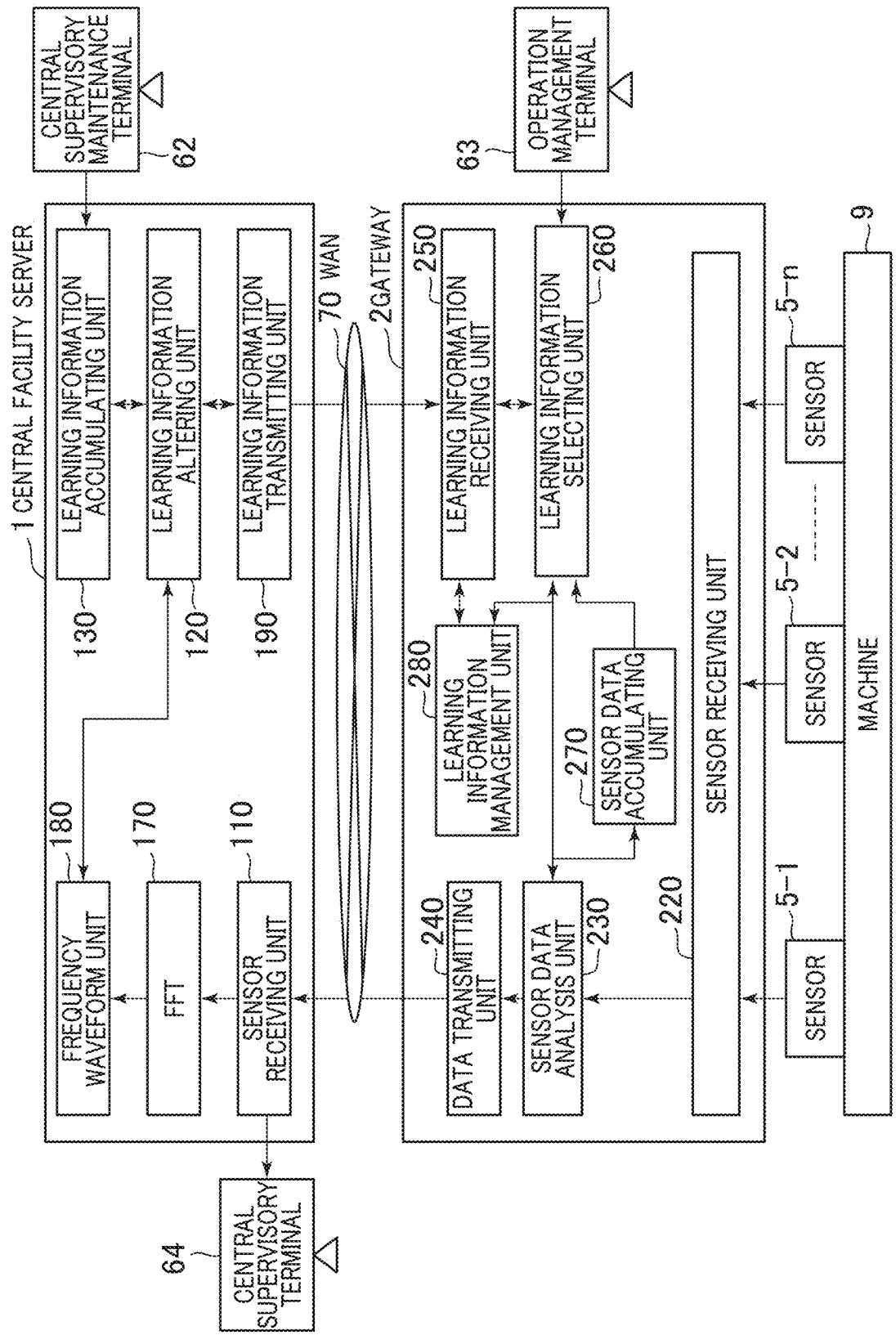
FIG. 2 is a block diagram depicting an example of a functional configuration of the data collection system.

FIG. 2 is a diagram depicting one example of functional blocks constituting the data collection system. In the example of FIG. 2, the central facility server 1 is connected to a gateway 2 via WAN 70 and collects sensor data from one or more (e.g., n pieces of) sensors 5 (sensors 5-1 to 5-$n$) installed on a machine 9 that is a monitored object. Now, in the following description, sets of a sensor 3 and a sensor node 4 described with FIG. 1 will be referred to as the "sensors 5". In addition, hereinafter, the n pieces of sensors may be termed "sensor #1", "sensor #2", . . . "sensor #n" as their identifiers (names).

The sensors 5 transmit sensor data obtained by measuring the state of the machine 9 to the gateway 2. Electric power of the sensors 5 can be supplied from a battery cell (or a storage battery) which is not depicted. Now, the sensors 5 may be configured to have a solar battery panel so that the power will be supplied from the solar battery panel to the sensors 5; no limitation to driving the sensors 5 by a battery cell is intended.

In addition, the sensors 5 may be connected to the gateway 2 via a wired network or may be connected via a wireless network.

In addition, the type of the sensors 5 which are used for sensor data collection is not limited to a specific one. According to the type of information (such as a physical quantity) desired to be acquired from the machine 9 that is a monitored object, a suitable type of the sensors 5 may expediently be used. The present embodiment describes an example in which the data collection system is intended to detect an abnormality (or a predictor of abnormality) by observing vibration that is generated by the machine 9. Therefore, the embodiment describes an example in which the sensors 5 that are capable of measuring a displacement (or, alternatively, information, such as acceleration, from which a displacement can be calculated), for example, acceleration sensors, are used.

The sensors 5 measure a displacement periodically (according to a sampling period) and this measurement value (displacement) is continuously transmitted to the gateway 2. That is, time-series data of measurement values is output from the sensors 5. The gateway 2 appends a time stamp (a time instant when each measurement of displacement was taken) to each of the measurement values received from the sensors 5 and outputs the measurement values to the central facility server 1. Now, instead of that the gateway 2 appends time stamps to the measurement values (displacement) received from the sensors 5, the sensors 5 may create information in which a time stamp is appended to a measurement value and transmit it to the gateway 2.

The gateway 2 transmits sensor data to the central facility server 1 and carries out detecting an abnormality of the machine 9 that is a monitored object. In particular, the gateway 2 performs frequency analysis of sensor data acquired from each sensor 5, obtains a frequency spectrum, and extracts data in a predetermined frequency range from the spectrum. A frequency range that is used when extracting data is initially determined by the central facility server 1 through learning processing, but may be changed by the gateway 2 subsequently. A method of determining a frequency range will be detailed later.

Moreover, from within the extracted data, the gateway 2 specifies a frequency at which amplitude (or vibration intensity) is the greatest (this will be referred to as a "frequency peak" hereinafter). By specifying a frequency peak iteratively, the gateway 2 calculates a shift velocity of the frequency peak. Then, when the shift velocity has exceeded a preconfigured set value, the gateway 2 determines that an abnormality has occurred and notifies the central facility server 1 that the abnormality has occurred.

Now, an operation management terminal 63 equipped with input/output devices including a keyboard, a display, etc. is connected to the gateway 2 to check information on the sensors 5 associated with the gateway and rewrite setting information or the like. The operation management terminal 63 is used by an in-situ worker or the like. The in-situ worker operates the gateway 2 using the input/output devices of the operation management terminal 63.

Functional elements of the gateway 2 are described below. The gateway 2 includes a sensor receiving unit 220 which receives sensor data from the sensors 5, a sensor data analysis unit 230 which performs sensor data analysis processing, in particular, frequency analysis by fast Fourier Transform (FFT), a data transmitting unit 240 which transmits sensor data received via the WAN 70 to the central facility server 1, a learning information receiving unit 250 which receives learning information from the central facility server 1 via the WAV 70, a learning information selecting unit 260 which selects a sensor data analysis range, a sensor data accumulating unit 270 which temporarily retains sensor data, and a learning information management unit 280 which retains learning information. These functional elements are implemented by software (programs).

In a case where the gateway 2 performs collection of sensor data from the sensors 5 by polling, the sensor receiving unit 220 performs collection of sensor data from the sensors 5 according to a predetermined sampling period of sensor data. Now, the sampling period may differ for each of the sensors 5.

Now, although the case where the gateway 2 performs collection of sensor data from the sensors 5 by polling has been described; in an alternative arrangement, the gateway 2 may transmit a sampling frequency (or a sampling period) to the sensors 5 and the sensors 5 may perform sensing according to the sampling frequency (or sampling period) received by the sensors 5.

Functional elements of the central facility server 1 that collects sensor data from the gateway 2 via the WAN 70 are described below.

The central facility server 1 monitors the machine 9, based on sensor data received from the gateway 2, and outputs information such as monitoring results to a central supervisory terminal 64. The central supervisory terminal 64 is equipped with input/output devices including a keyboard, a display, etc.

The central facility server 1 includes a sensor receiving unit 110 which receives sensor data transmitted from the gateway 2 and accumulates the sensor data, an FFT module 170 (hereinafter abbreviated to "FFT 170") which performs frequency analysis of sensor data from the sensors 5, based on the received sensor data, and a frequency waveform unit 180 which accumulates frequency analysis results. The FFT 170 performs frequency analysis by fast Fourier Transform, like the sensor data analysis unit 230 does.

The central facility server 1 further includes a learning information accumulating unit 130 which stores information that is used for a learning process, a learning information altering unit 120 which creates (or alters) learning information, and a learning information transmitting unit 190 which transmits learning information to the gateway 2. Respective tables that the learning information accumulating unit 130 has will be described later. These functional elements are implemented by software (a program).

In addition, a central supervisory maintenance terminal 62 is connected to the central facility server 1. The central supervisory maintenance terminal 62 is a terminal for a maintenance worker to carry out writing information to the learning information accumulating unit 130 and updating and modifying such information and is equipped with input/output devices including a keyboard, a display, etc., like the central supervisory terminal 64.

Now, the quantity of the central facility server 1, gateway 2, sensors 5, and machine 9 is not limited to that as depicted in FIG. 2. In addition, for the central supervisory maintenance terminal 62, central supervisory terminal 64, and operation management terminal 63, places to which they are connected are not limited to positions as depicted in FIG. 2.

Figure 3:
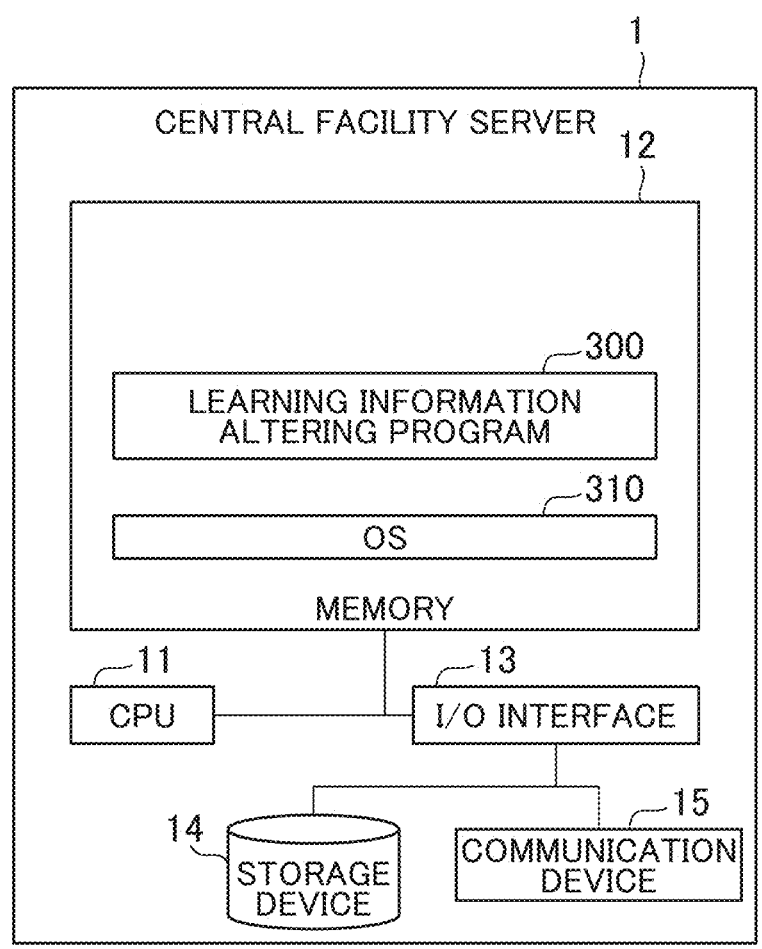
FIG. 3 is a diagram depicting one example of a hardware configuration of a central facility server.

FIG. 3 is a diagram depicting one example of a configuration of the central facility server 1. The central facility server 1 includes a processor (CPU) 11 which performs arithmetic processing, a memory 12 for storing a program and data, an I/O interface 13 connected to the CPU 11, a storage device 14 which is connected to the I/O interface 13 and retains programs and data, and a communication device 15 which is connected to the I/O interface 13 and performs communication with the WAN 70. In the present embodiment, devices that are connected to the CPU 11 via the I/O interface 13, like the storage device 14 and the communication device 15, are referred to as "I/O devices".

The I/O interface 13 is, for example, configured using a controller device complying with PCIexpress standards and carries out communication between the CPU 11 and the I/O devices.

An OS 310 and a learning information altering program 300 are loaded into the memory 12 and executed by the CPU 11. In particular, the OS 310 and the learning information altering program 300 are stored in the storage device 14, loaded into the memory 12 upon startup of the central facility server 1, and executed by the CPU 11. Now, the central supervisory maintenance terminal 62 and the central supervisory terminal 64 depicted in FIG. 2 are connected to the central facility server 1 via a LAN which is not depicted. Alternatively, the central supervisory maintenance terminal 62 and the central supervisory terminal 64 may be connected to the central facility server 1 via the communication device 15.

Although described previously, the respective functional elements depicted in FIG. 2, namely, the sensor receiving unit 110, FFT 170, frequency waveform unit 180, learning information accumulating unit 130, learning information altering unit 120, and learning information transmitting unit 190 are implemented as software (programs). That is, the CPU 11 executes the learning information altering program 300 using the memory 12 and the I/O devices, thereby making the central facility server 1 function as a device having the respective functional elements depicted in FIG. 2.

In addition, in the present specification, a description of processing may be given, regarding one of the functional elements, i.e., the learning information altering unit 120 and others, as an actor that performs processing operations. However, because the respective functional elements are functions that are implemented by the fact that a program (the learning information altering program 300) is executed by the CPU 11 as described above, processing that is described as if its operations were performed by one of the functional elements in the central facility server 1 is actually meant to be executed by the CPU 11. In addition, the learning information altering program 300 may be provided, stored in a computer readable, non-transitory data storage medium such as an IC card, SD card, and DVD.

Figure 4:
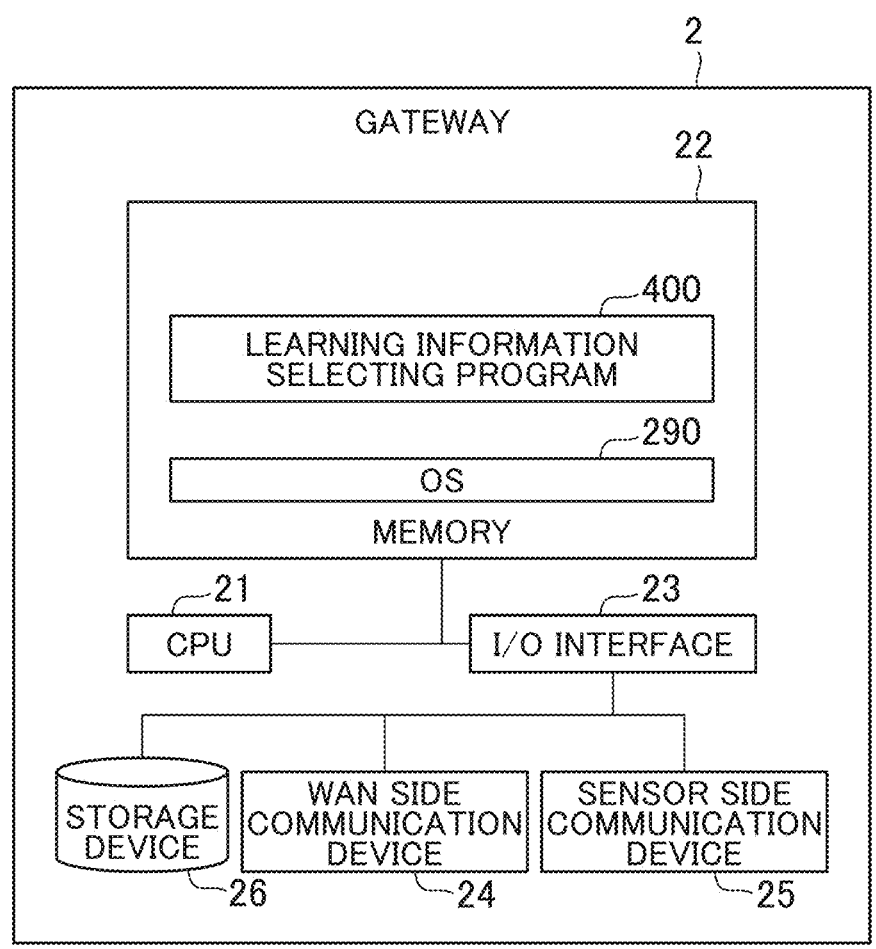
FIG. 4 is a diagram depicting one example of a hardware configuration of a gateway.

FIG. 4 is a block diagram depicting one example of a configuration of the gateway 2. The gateway 2 includes a CPU 21 which performs arithmetic processing, a memory 22 for storing a program and data, an I/O interface 23 connected to the CPU 21, a WAN side communication device 24 which is connected to the I/O interface 23 and performs communication with the WAN 70, a sensor side communication device 25 which is connected to the I/O interface 23 and performs communication with the sensors 5, and a storage device 26 which is connected to the I/O interface 23 and retains programs and data. The I/O interface 23 is, for example, configured using a controller device complying with PCIexpress standards and carries out communication between the CPU 21 and the I/O devices. Now, the operation management terminal 63 depicted in FIG. 2 is connected to the gateway 2 via a LAN which is not depicted.

An OS 290 and a learning information selecting program 400 are loaded into the memory 22 and executed by the CPU 21.

As is the case for the central facility server 1, respective functional elements of the gateway 2 are also implemented as software. That is, the CPU 21 of the gateway 2 executes the learning information selecting program 400 using the memory 22 and the I/O device, thereby making the gateway 2 function as a device provided with the respective functional elements in the gateway 2 depicted in FIG. 2, namely, the sensor receiving unit 220, sensor data analysis unit 230, data transmitting unit 240, learning information receiving unit 250, learning information selecting unit 260, and sensor data accumulating unit 270. Hence, although, in the present specification, a description of processing may be given, regarding one of the functional elements, i.e., the learning information selecting unit 260 and others, as an actor that performs processing operations, processing that is described as if its operations were performed by one of the functional elements in the gateway 2 is actually meant to be executed by the CPU 21. In addition, the learning information selecting program 400 may be provided, stored in a computer readable, non-transitory data storage medium such as an IC card, SD card, and DVD.

Figure 5:
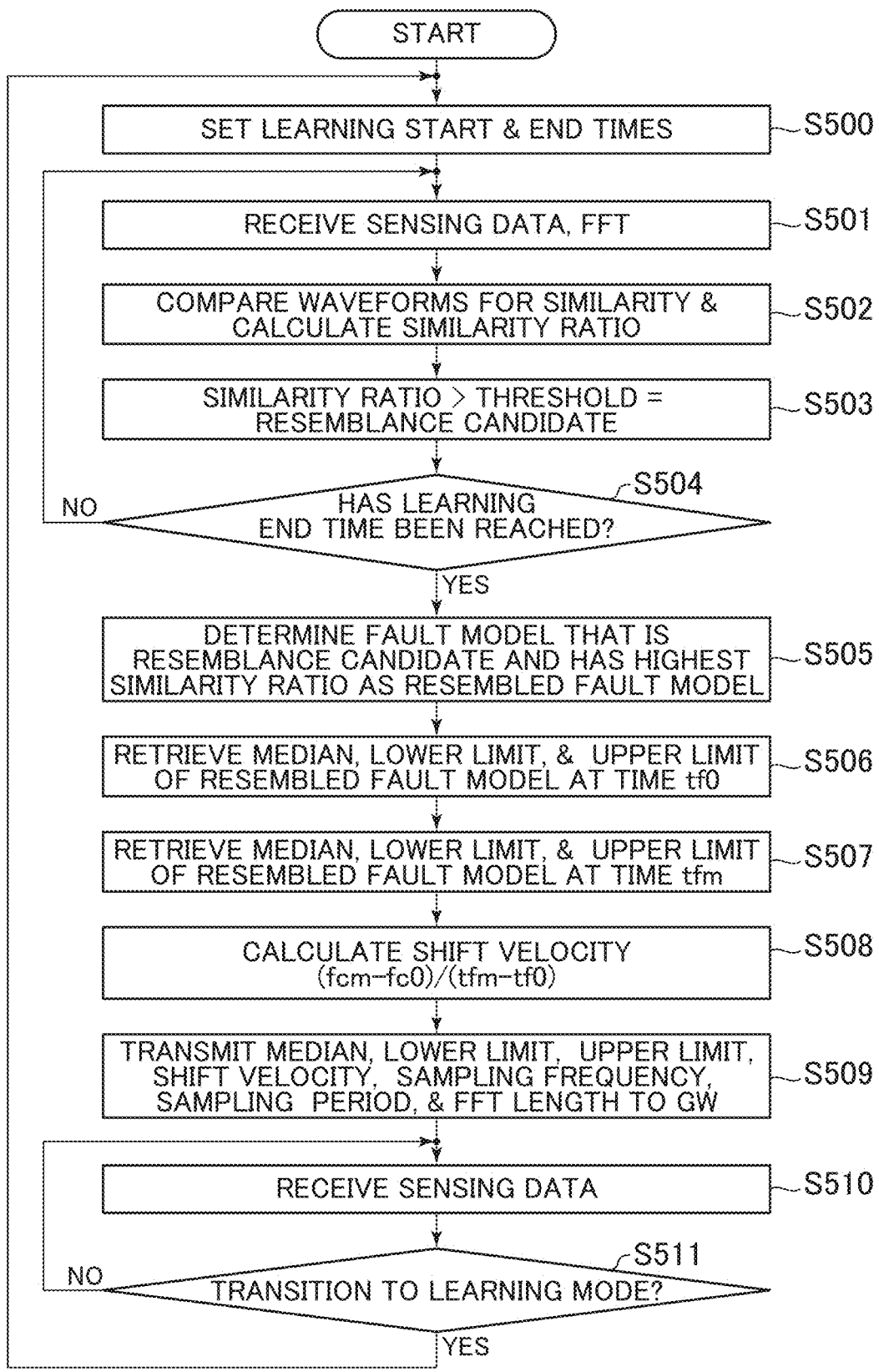
FIG. 5 is a flowchart illustrating one example of processing that is performed by a learning information altering unit of the central facility server.

FIG. 5 is a flowchart illustrating one example of processing that is performed by the learning information altering unit 120 in the central facility server 1. This processing is performed whenever the central facility server 1 has received a predetermined amount of sensor data of the sensors 5 (in particular, an amount equal to or more than FFT length) from the gateway 2 via the WAN 70. Also, this processing is performed on a per-sensor basis.

Before explaining the flow illustrated in FIG. 5, a description is given of several pieces of information that are used by the learning information altering unit 120. Sensor data (time-series data of measurement values) transmitted from the gateway 2 is stored in a sensor data table 600 which belongs to the sensor receiving unit 110. An example of the sensor data table 600 is depicted in FIG. 6. Every row (record) of the sensor data table 600 has data in the following columns: time stamp 601, sensor #1 (602), sensor #2 (603), . . . sensor #n (604). Measurement values (displacements) of the respective sensors are registered in the columns of sensor #1 (602), sensor #2 (603), . . . sensor #n (604) and the time stamp 601 indicates a time instant when the measurement values stored in the columns 602 to 604 were measured.

The learning information altering unit 120 performs frequency analysis (FFT) of sensor data received from the gateway 2 for a predetermined period (which is referred to as a "learning period") and compares frequency analyzed data with one of fault models which are pieces of information for comparison stored in advance. First, a description is given with regard to a number-of-learning-operations management table 1000 in which information about learning periods is recorded.

FIG. 10 depicts an example of the number-of-learning-operations management table 1000. The number-of-learning-operations management table 1000 is a table which belongs to the learning information accumulating unit 130 and is for management of learning information per sensor. Sensor names are stored in a sensor 1001 column and a period of learning using sensor data acquired from a sensor specified in the sensor 1001 column is stored in a learning period 1002 column. Information which is stored in the sensor 1001 and learning period 1002 columns is specified by a worker. In particular, the worker sets sensor names and learning periods in the sensor 1001 and learning period 1002 columns of the number-of-learning-operations management table 1000 using the central supervisory maintenance terminal 62.

Meanwhile, the learning information altering unit 120 sets values in columns of learning start time 1003 and learning end time 1004, when starting the processing in FIG. 5. Contents of information that is set in the columns of learning start time 1003 and learning end time 1004 will be described later.

Then, a frequency analysis parameter table 800 is described. The frequency analysis parameter table 800 is a table which stores information required for frequency analysis, such as a sampling frequency, per sensor 5 and belongs to the learning information accumulating unit 130.

FIG. 8 depicts an example of the frequency analysis parameter table 800. Every row (record) of the frequency analysis parameter table 800 has data in the following columns: sensor 801, sampling frequency 802, sampling period 803, and FFT length 804. These pieces of information are those that are set by the worker using the central supervisory maintenance terminal 62. Also, these pieces of information are those that set are per sensor 5.

The sampling frequency 802, sampling period 803, and FFT length 804 columns hold information that is used for frequency analysis (FFT) (i.e., sampling frequency, sampling period, and FFT length) and sensor names are stored in the sensor 801 column. For instance, when the learning information altering unit 120 performs frequency analysis of sensor data collected from "sensor #1", it performs frequency analysis according to values held in the sampling frequency 802 (or sampling period 803) column and the FFT length 804 column for a row with "sensor #1" stored in the sensor 801 column.

Additionally, although there are other pieces of information than mentioned above that the learning information altering unit 120 uses, a description is given about such pieces of information in the course of explaining the flow of processing that is performed by the learning information altering unit 120.

From now, the processing that is performed by the learning information altering unit 120 is described. Now, in the following description, an example of a processing flow when the learning information altering unit 120 performs the processing on sensor data collected with one sensor 5 (the sensor name of this sensor 5 is assumed to be "sensor #s") is described, unless otherwise stated. When the learning information altering unit 120 is started to run, registering values into the number-of-learning-operations management table 1000 which belongs to the learning information accumulating unit 130 is first carried out (step 500). In the step 500, the learning information altering unit 120 registers the current time instant in the learning start time 1003 column and registers, in the learning end time 1004 column, a value (time instant) given by adding a learning period specified in the learning period 1002 column to the time instant registered in the learning start time 1003 column.

Then, the learning information altering unit 120 receives sensor data of sensor #s from the sensor receiving unit 110, performs frequency analysis of the sensor data through the use of the FFT 170, and accumulates a result (a frequency spectrum) of the frequency analysis into the frequency waveform unit 180 (step 501). When performing the frequency analysis, the learning information altering unit 120 (and the FFT 170) performs the analysis according to information stored in the frequency analysis parameter table 800.

Figure 13:
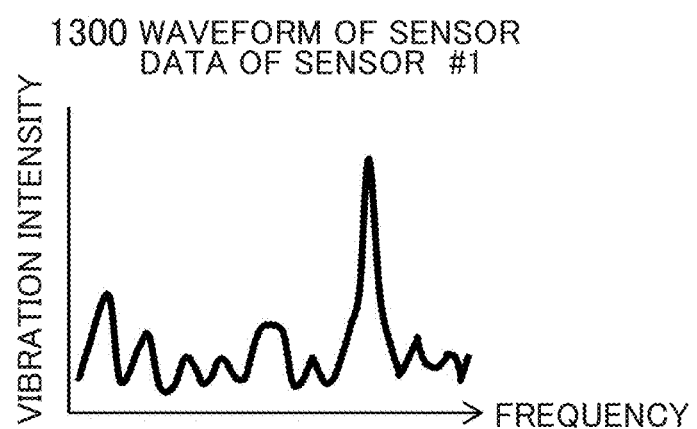
FIG. 13 is a diagram depicting an example of a waveform of sensor data.

An example of a result (a frequency spectrum) of the frequency analysis of sensor data, which is accumulated into the frequency waveform unit 180, is depicted in FIG. 13. FIG. 13 is a graph representation of a frequency spectrum with the ordinate indicating vibration intensity (signal intensity) and the abscissa indicating frequency. In the present embodiment, a frequency spectrum of sensor data or a graph representation of this frequency spectrum is referred to as a "waveform". Also, in the following description, a waveform obtained by frequency analysis of sensor data of sensor #s acquired at step 501 is referred to as the "waveform of sensor #s".

Now, although a result of frequency analysis is represented as a graph in FIG. 13 for explanatory purposes, information represented as a graph (graphics, images, etc.) as in FIG. 13 does not necessarily have to be recorded into the frequency waveform unit 180. A sequence of data on frequency and vibration intensity may expediently be recorded into the frequency waveform unit 180.

Figure 12:
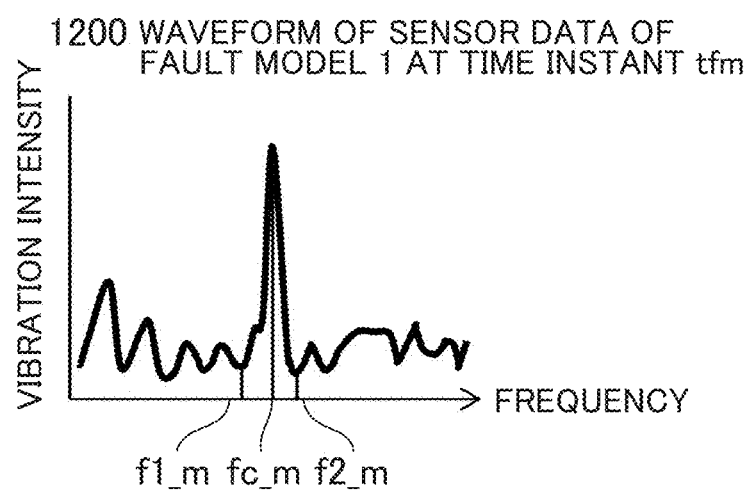
FIG. 12 is a diagram depicting an example of a waveform of a fault model.

FIG. 11 and FIG. 12 are examples of waveforms of fault models. In the data collection system pertaining to the present embodiment, sensor data collected in the past, e.g., from a variety of machines, until they have failed is retained beforehand and such sensor data is referred to as "fault models" in the present embodiment. The fault models are used as those with which the frequency spectrum of sensor data obtained at step 501 is compared. Now, the waveforms of fault models mean frequency spectra (or their graph representations) obtained by frequency analysis of sensor data collected from a variety of machines in the past. Waveforms 1101 to 1103 in FIG. 11 and a waveform 1200 in FIG. 12 are graph representations of frequency spectra obtained by frequency analysis of fault models, like the one described with FIG. 13 previously.

The fault models are stored into the learning information accumulating unit 130 (more exactly, stored into a frequency analysis data table 700 which belongs to the learning information accumulating unit 130). An optional manner in which to store fault model data may be adopted. For example, a result (a frequency spectrum) of frequency analysis of a fault model may be stored into the learning information accumulating unit 130 or a fault model itself (data before being subjected to frequency analysis) may be stored into the learning information accumulating unit 130. In addition, fault models are not necessarily sensor data collected from actual machines. For example, data created artificially through simulation or the like may be used as fault models.

In the following description, an example in which fault models are sensor data collected from actual machines and a result of frequency analysis of a fault model (its waveform) is stored into the learning information accumulating unit 130 is described. However, to avoid redundancy of description, it may be noted that "fault models" are stored in the learning information accumulating unit 130.

In the data collection system pertaining to the present embodiment, plural types (e.g., n types) of fault models are stored in the learning information accumulating unit 130. Sensor data collected from, e.g., plural types of machines is stored as fault models. In the following, plural fault models are termed "fault model 1", "fault model 2", … "fault model n" and "fault model 1", "fault model 2", etc. are also referred to as fault model identifiers.

In addition, in the learning information accumulating unit 130, frequency analysis results at multiple points of time are stored per fault model. In the present embodiment, an example in which a fault model waveform at a time instant (which is termed tf0) and plural waveforms of the fault model obtained from the time instant tf0 to a time instant (termed tfm, where m is a given natural number) after elapse of m hours (or, instead, m seconds and m minutes) from the time instant tf0 is described. In particular, the waveforms of a fault model at time instants, tf0, tf1, tf2, … tfm are stored per fault model in the learning information accumulating unit 130. Now, a time instant when each model is acquired does not necessarily have to be the same time instant. As the waveform of each fault model, data for a period of m hours (or m seconds and m minutes) from a time instant may expediently be stored in the learning information accumulating unit 130 and the time instant when sensor data of each model is acquired may differ. Now, the waveforms 1101 to 1103 in FIG. 11 represent the waveforms of fault model 1, fault model 2, and fault model n at time instant tf0 respectively, whereas the waveform 1200 in FIG. 12 represents the waveform of fault model 1 at time instant tfm.

The learning information accumulating unit 130 has the frequency analysis data table 700 for storing fault models. FIG. 7 depicts an example of the frequency analysis data table 700. In every row (record) of the frequency analysis data table 700, the frequency spectrum of a fault model at a point of time is stored. In a data sequence 705 column for each row, plural sets of frequency and its related vibration intensity are stored as the frequency spectrum of a fault mode at each of time instants which are stored in a time instant 705 column. Additionally, frequency analysis data tables 700 are provided for each fault model. If there are n fault models, the learning information accumulating unit 130 has n frequency analysis data tables 700.

In every row (record) of the frequency analysis data table 700, a median 702, a lower limit 703, and an upper limit 704 are further stored. The median, lower limit, and upper limit in the present embodiment are defined as follows. A frequency at a point at which vibration intensity becomes maximum in a waveform (a frequency spectrum obtained by frequency analysis of sensor data) is referred to as a "median". Also in the waveform, frequency at a lowest frequency point which is one of points at which vibration intensity becomes minimum is referred to as a "lower limit" and frequency at a highest frequency point which is one of points at which vibration intensity becomes minimum is referred to as an "upper limit". The lower and upper limits are information that is used to narrow down information which is used for the gateway 2 to carry out detecting an abnormality of the machine 9 using sensor data. Details will be described later.

Also in the present embodiment, a lower limit, an upper limit, and a median of a waveform at time instant tfk (where k is an integer equal to or more than 0) are termed "f1_k", "f2_k", and "fc_k", respectively. In graphs depicted in FIG. 11, examples of the waveforms of fault models 1, 2, and n at time instant tf0 are represented and frequency points of fc_0, f1_0, and f2_0 correspond to the median, lower limit, and upper limit, respectively.

At step 502, the learning information altering unit 120 compares a result of sensor data accumulated in the frequency waveform unit 180 with each of the fault models stored in the frequency analysis data tables 700 to see what degree of similarity exists between them, and calculates a similarity ratio. A similarity ratio is calculated per fault model.

A similarity ratio obtained at step 502 is registered into a similarity management table 900 which is depicted in FIG. 9. The similarity management table 900 is one of the tables which belong to the learning information accumulating unit 130 and the similarity management table 900 is provided per sensor. Every row of the similarity management table 900 has data in the following columns: fault model 901, similarity ratio 903, and resemblance candidate 904. Fault model identifiers are stored in the fault model 901 column.

When a similarity ratio is calculated, comparison of the waveform of the sensor #s with the waveform of each of the fault models is carried out at step 502 and a similarity ratio that is determined from a result of such comparison is registered into the similarity ratio 903 column. A similarity ratio should preferably be calculated by a predefined formula. Now, in the present embodiment, a similarity ratio (a value to be recorded into the similarity ratio 903 column) that is calculated by the learning information altering unit 120 should be a value falling within a range from 0 to 1. A similarity ratio that is closer to 1 signifies that the result of frequency analysis of sensor data has more likeness to the fault model's waveform.

As described previously, for a fault model, its waveforms at respective time instants (the fault model's waveforms at time instants tf0, tf1, tf2, . . . tfm) are stored in the learning information accumulating unit 130. When the learning information altering unit 120 makes comparison with the waveforms of, e.g., a fault model a (1≤a≤n) at step 502, by comparing the waveform stored into the frequency waveform unit 180 with each of the waveforms of the fault model a at the respective time instants, it obtains plural values of similarity ratio (a similarity ratio is a value falling within a range from 0 to 1 and such value closer to 1 signifies more likeness between waveforms) and determines a maximum one of those values as a ratio of similarity to the waveform of the fault model a. Because the learning information altering unit 120 executes similarity ratio calculations with respect to all fault models (fault models 1, 2, . . . n), n similarity ratios are eventually at step 502. In addition, as a method of determining a similarity ratio between a data sequence like a result of sensor data analysis accumulated in the frequency waveform unit 180 and another data sequence, various statistical methods, such as a dynamic time warping method, are known; anyone of these publicly known methods should preferably be used here.

At step 503, the learning information altering unit 120 registers "○" into the resemblance candidate 904 column, if a similarity ratio obtained per fault model at step 502 is equal to or more than a preset similarity ratio threshold, and registers "x" into the resemblance candidate 904 column, if the similarity ratio is less than the preset similarity ratio threshold.

At step 504, the learning information altering unit 120 determines whether or not the current time (a time instant at which step 504 is being executed) has reached the learning end time 1004; if not so, a transition is made to step 501, and if so, a transition is made to step 505. Determination as to whether or not the learning end time 1004 has been reached, which is executed at step 504, is carried out based on information contained in the number-of-learning-operations management table 1000 which is depicted in FIG. 10.

At step 505, based on information set in the similarity ratio 903 and resemblance candidate 904 columns of the similarity management table 900, as determined at step 503, the learning information altering unit 120 determines what fault model's waveform that the waveform acquired from the sensor 5 resembles and determines a resembled fault model. If "o" is registered in plural cells of the resemblance candidate 904 column, a fault model having the highest value in the similarity ratio 903 column is selected as a resembled fault model.

At step 506, the learning information altering unit 120 retrieves the median, lower limit, and upper limit of the resembled fault model determined at step 505 at time tf0 from the frequency analysis data table 700.

At step 507, the learning information altering unit 120 retrieves the median, lower limit, and upper limit of the resembled fault model determined at step 505 at time tfm from the frequency analysis data table 700.

For example, if it has been determined at step 505 that the waveform 1300 of sensor #1 in FIG. 13 resembles the waveform 1101 (FIG. 11) of the fault model 1 at time tf0, the learning information altering unit 120 retrieves the median 702 (fc_0), lower limit 703 (f1_0), and upper limit 704 (f2_0) in a row with "tf0" as a time instant 701 from the frequency analysis data table 700 for the fault model 1 at step 506 and, moreover, retrieves the median 702 (fc_0), lower limit 703 (f1_0), and upper limit 704 (f2_0) in a row with "tfm" as a time instant 701 from the frequency analysis data table 700 for the fault model 1 at step 507.

At step 508, the learning information altering unit 120 calculates shift velocity of a peak value (median) of frequency, using two medians (fc_0, fc_m) obtained at steps 506 and 507. Shift velocity is a value indicating the amount of median change per unit time and is obtained by calculating (fc_m−fc_0)/(tfm_−tf0). As another embodiment, the central facility server 1 may retain in advance shift velocity of a median in the frequency analysis data tables 700. In that case, the learning information altering unit 120 does not have to execute shift velocity calculation at step 508 and may only retrieve shift velocity from the frequency analysis data table 700.

At step 509, the learning information altering unit 120 stores the median, lower limit, and upper limit retrieved at step 506, the shift velocity calculated at step 508, and the sampling frequency 802, sampling period 802, and FFT length per sensor 801 which have been registered beforehand in the frequency analysis parameter table 800 into the learning information management table 400 and transmits them to the gateway 2.

With reference to FIG. 14, the contents of the learning information management table 1400 are described. The learning information management table 1400 is a table for storing information including the median, shift velocity, and others obtained in processing up to step 508 and this also belongs to the learning information accumulating unit 130. The learning information management table 1400 has the following columns: sensor 1401, learning operating state 1402, median 1403, lower limit 1404, upper limit 1405, shift velocity 1406, sampling frequency 1408, sampling period 1408, and TTF length 1409.

In the columns of sensor 1401, sampling frequency 1407, sampling period 1408, and FFT length 1409, pieces of information that are the same as those registered in the columns of sensor 801, sampling frequency 802, sampling period 803, and FFT length 804 of the frequency analysis parameter table 800 are stored, respectively. Also, in the learning operating state 1402 column, "non-operating" is initially stored. The columns of median 1403, lower limit 1404, upper limit 1405, shift velocity 1406 are those for storing the median, lower limit, upper limit, and shift velocity of the resembled fault model obtained through the abovementioned steps 505 to 508 and no values are stored in these columns until step 509 is executed (in FIG. 14 (or FIGS. 16 to 18 which will be referred to later), a cell in which "none" is contained means that no value is stored therein).

At step 509, the learning information altering unit 120 stores pieces of information into cells of each field in a row with "sensor #s" specified in the sensor 1401 column among rows within the learning information management table 1400. In particular, the median, lower limit, and upper limit of the resembled fault model retrieved at step 506 are stored into the cells of the median 1403, lower limit 1404, and upper limit 1405 columns, the value determined at step 508 is stored in the cell of the shift velocity 1406 column, and "operating" is stored in the cell of the learning operating state 1402 column. Furthermore, the learning information altering unit 120 transmits the pieces of information contained in the cells of each field (in the columns from sensor 1401 to FFT length 1409) in the row with "sensor #s" specified in the sensor column 1401 to the gateway 2. In the present embodiment, information that is transmitted here is referred to as "learning information". Learning information creation and transmission processing by the learning information altering unit 120 has now terminated.

At step 510, the learning information altering unit 120 receives sensor data from the gateway 2 and accumulates that data into the sensor receiving unit 110. Now, the gateway 2 may or may not transmit sensor data to the central facility server 1. This depends on settings on the gateway 2 (details will be described later). If the gateway 2 is set not to transmit sensor data to the central facility server 1, the processing step 510 is not executed.

At step 511, the learning information altering unit 120 determines whether to make a transition to a learning mode. The learning mode is a mode in which the learning information altering unit 120 executes processing from step 500 to step 509 mentioned above. An instruction to make a transition to the learning mode is issued by a maintenance worker via the central supervisory maintenance terminal 62 of the central facility server 1. If the maintenance worker has issued the instruction to make a transition to the learning mode (step 511, YES), the learning information altering unit 120 executes the processing from step 500 again. If the maintenance worker does not issue the instruction to make a transition to the learning mode (step 511, NO), step 510 is executed again.

Now, the present embodiment has described an example in which the learning information altering unit 120 is provided in the central facility server 1 and the central facility server 1 performs the processing illustrated in FIG. 5, the processing of the learning information altering unit 120 (FIG. 5) may be executed in an entity other than the central facility server 1. For example, the processing may be executed in the gateway 2 or in a device other than the gateway. However, inter alia, in a case where processing performance of the gateway is low, to avoid putting excessive loads on the gateway 2, it is preferable to make the central facility server 1 perform the processing of the learning information altering unit 120 (FIG. 5).

Figure 15:
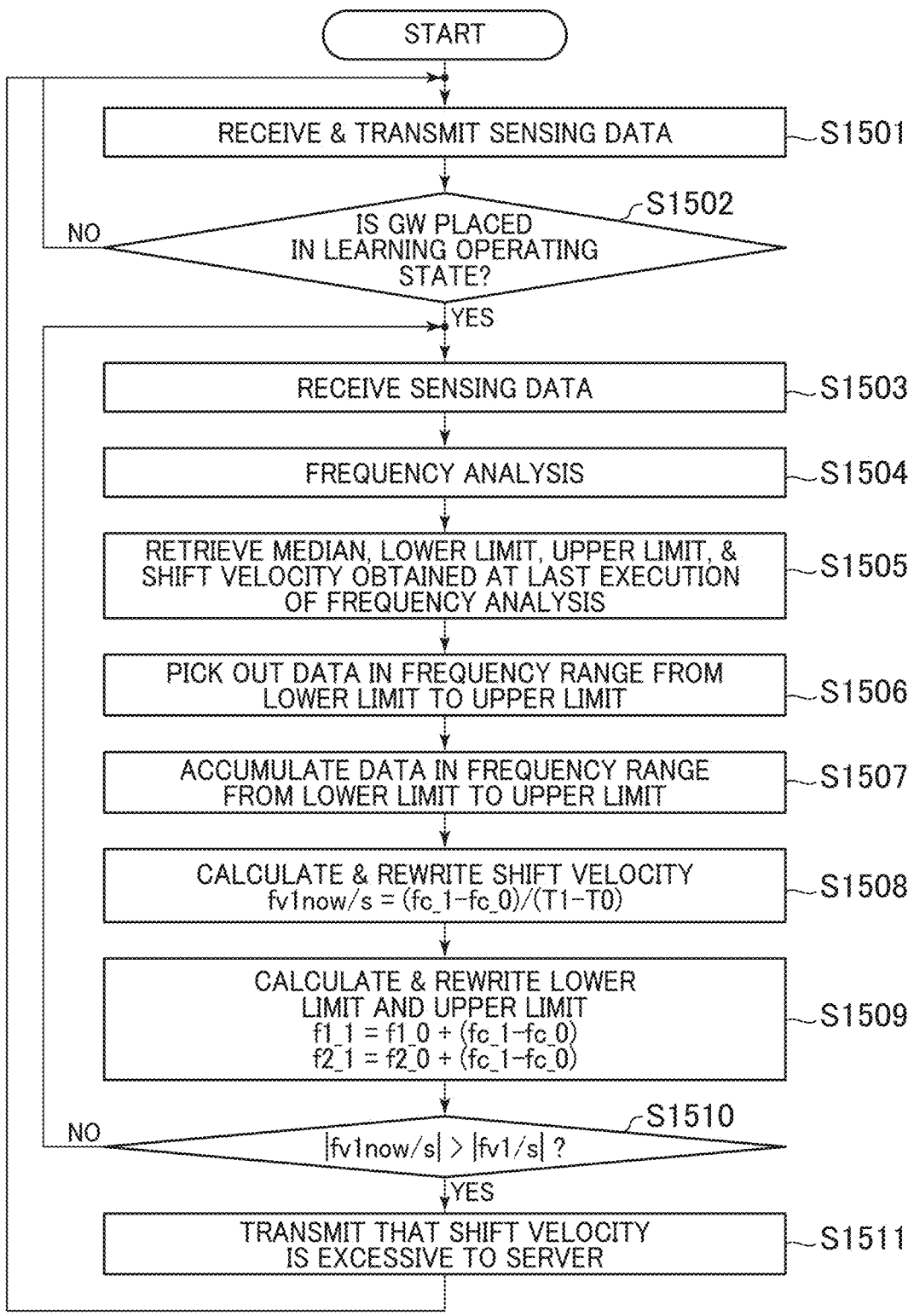
FIG. 15 is a flowchart illustrating one example of processing that is performed by a learning information selecting unit of the gateway.

FIG. 15 is a flowchart illustrating one example of processing that is performed by the learning information selecting unit 260 of the gateway 2. This processing is executed upon receiving sensor data from a sensor 5. This processing is also performed per sensor 5. Before explaining the flow illustrated in FIG. 15 is explained, a description is given of a learning information management table 1600 which belongs to the learning information management unit 280 of the gateway 2.

FIG. 16 depicts an example of the GW learning information management table 1600. The GW learning information management table 1600 is a table which is similar to the learning information management table 1400 described previously and is for storing learning information which is transmitted from the central facility server 1 (information that is transmitted at step 509). Also, the contents of the GW learning information management table 1600 are updated each time the processing of FIG. 15, which will be described later, is executed.

Among the columns of the GW learning information management table 1600, sensor 1601, learning operating state 1602, median 1603, lower limit 1604, upper limit 1605, shift velocity 1606, sampling frequency 1608, sampling period 1609, and FFT length 1610 are columns into which the same pieces of information are stored as existing in the columns of sensor 1401, learning operating state 1402, median 1403, lower limit 1404, upper limit 1405, shift velocity 1406, sampling frequency 1407, sampling period 1408, and FFT length 1409 of the learning information management table 1400. Into each of these columns, the learning information receiving unit 250 stores pieces of learning information (i.e., the pieces of information existing in the columns from sensor 1401 to FFT length 1409) which has been transmitted from the central facility server 1.

In FIG. 16, a row 1621 is the row in which information about sensor #1 was stored and a row 1622 is the row in which information about sensor #2 was stored. Also, the row 1621 represents a state in which learning information has been transmitted from the central facility server 1 and the row 1622 represents a state in which earning information has not yet been transmitted from the central facility server 1. Before transmission of learning information from the central facility server 1, as represented in the row 1622, there is a state in which no information is stored in the cells of the columns 1603 to 1610 and information is only stored in the cells of the columns labeled sensor 1601, learning operating state 1602, and sensor data transmission 1611. There is a state in which a sensor name and "non-operating" were stored in the cells of the columns labeled sensor 1601 and learning operating state 1602, respectively.

Meanwhile, either "transmit" or "not transmit" is stored in the cell of the sensor data transmission 1611 column and, when "transmit" is stored, the gateway 2 transmits sensor data to the central facility server 1. For example, an in-situ work may determine which information is stored in the sensor data transmission 1611 column may be determined by an in-situ worker. For example, if the worker does not want accumulate sensor data of sensor #1 on the facility server 1, whereas he or she wants to accumulate sensor data of sensor #2, the worker may preferably set "not transmit" in the cell of the sensor data transmission 1611 column in the row 1621 and set "transmit" in the cell of the sensor data transmission 1611 column in the row 1622.

Now, if "non-operating" is specified in the learning operating state 1602 column, sensor data is transmitted from the gateway 2 to the central facility server 1, even though "not transmit" is set in the sensor data transmission 1611 column. This is because learning processing has to be performed on the central facility server 1.

In addition, values contained in the columns of median 1603, lower limit 1604, upper limit 1605, and current value of shift velocity 1607 are updated, each time the learning information selecting unit 260 executes the processing which will be described below.

In the following, a description is given of the flow of the processing that is executed by the learning information selecting unit 260. Now, in the following description, an example of the processing flow when the learning information selecting unit 260 performs the processing on sensor data collected with one sensor 5 (the sensor name of this sensor 5 is assumed to be "sensor #s") is described, unless otherwise stated.

At step 1501, the learning information selecting unit 260 receives sensor data via the sensor receiving unit 220, accumulates the thus acquired sensor data into the sensor data accumulating unit 270, and transmits the sensor data to the central facility server 1 via the data transmitting unit 240.

At step 1502, the learning information selecting unit 260 carries out determining whether or not the gateway is placed in the learning operating state. Determining whether or not the gateway is placed in the learning operating state is made according to a value registered in the learning operating state 1602 column of the GW learning information management table 1600. When learning information on the sensor #s has been transmitted to the gateway by executing step 509, described previously, on the central facility server 1, the gateway 2 stores the learning information into the row for the sensor #s in the GW learning information management table 1600. As a result, the cell of the learning operating state 1602 column for the sensor #s is filled with "operating".

If the value registered in the learning operating state 1602 column of the GW learning information management table 1600 is "operating", the learning information selecting unit 260 then executes step 1503; or it returns to step 1501, if the value registered in the learning operating state 1602 column of the GW learning information management table 1600 is "non-operating". That is, if the gateway is not placed in the learning operating state, (until learning information is transmitted from the central facility server 1), the gateway 2 only performs processing of transmitting sensor data received from the sensor to the central facility server 1.

Processing of step 1503 and subsequent is executed, if it has been determined that the gateway is placed in the learning operating state as a result of the determination at step 1502. Now, the processing of step 1503 and subsequent is repeatedly executed, unless an abnormality is determined at step 1509 which will be described later.

At step 1503, the learning information selecting unit 260 receives sensor data of the sensor #s via the sensor receiving unit 220.

At step 1504, the learning information selecting unit 260 performs frequency analysis of the sensor data of the sensor #s using the sensor data analysis unit 230. Also, at step 1504, the learning information selecting unit 260 carries out frequency analysis through the use of values set in the cells of the fields of sampling frequency 1608, sampling period 1609, and FFT length 1610, respectively, registered in the GW learning information management table 1600.

At step 1505, the learning information selecting unit 260 retrieves the median 1603, lower limit 1604, upper limit 1605, and shift velocity 1606 with regard to the sensor #s from the GW learning information management table 1600. Because the median 1603, lower limit 1604, and upper limit 1605 are updated each time the learning information selecting unit 260 is executed, the median 1603, lower limit 1604, and upper limit 1605 obtained at the last execution of the processing of FIG. 15 is to be retrieved. However, when the processing of FIG. 15 is executed for the first time, information which is retrieved from the GW learning information management table 1600 is learning information transmitted from the central facility server 1.

At step 1506, from a result of frequency analysis of the sensor data analyzed at step 1504, the learning information selecting unit 260 picks out a result of frequency analysis in a frequency range which is specified by the values of lower limit 1604 and upper limit 1605 and determines a median from within the picked out result of frequency analysis. Now, the frequency range which is specified by the values of lower limit 1604 and upper limit 1605 in the GW learning information management table 1600 is referred to as a "sensing range".

Figure 19:
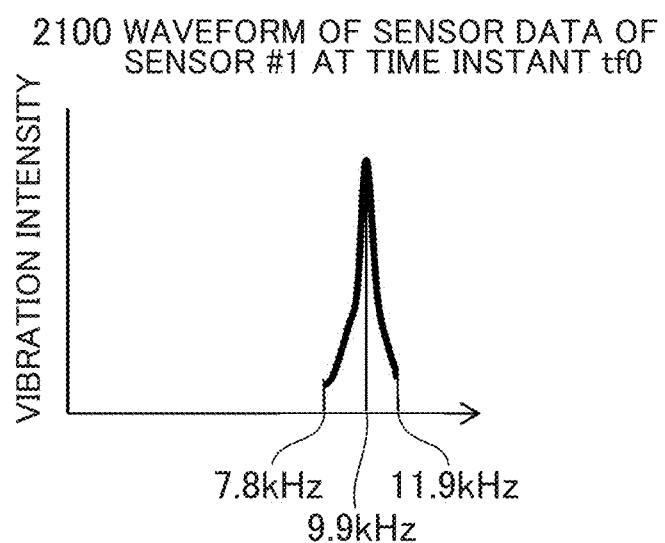
FIG. 19 is a diagram depicting one example of a waveform of sensor data that is stored into a sensor data accumulating unit.

For example, given that a waveform depicted in FIG. 13 is obtained as a result of frequency analysis performed at step 1504 and the lower limit and upper limit retrieved at step 1505 are 7.8 kHz and 11.9 kHz, the learning information selecting unit 260 extracts only a waveform in the range of 7.8 to 11.9 kHz from the waveform depicted in FIG. 13. An example of the extracted waveform is depicted in FIG. 19. Also, the learning information selecting unit 260 determines a median (a frequency at which vibration intensity is greatest) from this extracted waveform. In the example in FIG. 19, the median is determined to be 9.9 kHz, because the frequency at which vibration intensity is greatest is 9.9 kHz.

In the following description, T1 is taken to denote a time instant (current time) at which the learning information selecting unit 260 is executed this time and T0 to denote a time instant the learning information selecting unit 260 was last executed. Also, "fc_1" is taken to denote a median determined by executing step 1506 this time and "fc_0" to denote a median which was last determined (at time instant T0). Now, the median (fc_0) which was determined through the last execution of the processing is the median 1603 retrieved from the GW learning information management table 1600 at step 1505.

At step 1507, the learning information selecting unit 260 accumulates the waveform of the sensor data picked out at step 1506 into the sensor data accumulating unit 270. Conversely, the remaining part of the waveform not picked out at step 1506 may be discarded at this point of time.

Now, at step 1507, a determination as to whether to accumulate the waveform of the sensor data picked out at step 1506 is made according to information preset in the sensor data transmission 1611 column of the GW learning information management table 1600. If "not transmit" has been set in the sensor data transmission 1611 column, the learning information selecting unit 260 does not accumulate the waveform into the sensor data accumulating unit 270 at step 1507; if "transmit" has been set in the sensor data transmission 1611 column, the earning information selecting unit 260 accumulates the waveform into the sensor data accumulating unit 270 at step 1507. The waveform of the sensor data accumulated in the sensor data accumulating unit 270 is transmitted to the central facility server 1 at step 1509.

As described above, the learning information selecting unit 260 accumulates data limited to a necessary frequency band through the processing of steps 1505 to 1507, thereby making it possible to prevent increasing in the data amount to be accumulated.

At step 1508, the learning information selecting unit 260 calculates the shift amount and shift velocity of the frequency peak (median). Now, in the following, "fv1now/s" is taken to denote shift velocity that is calculated here.

In the present embodiment, a difference (fc_1−fc_0) between the median (fc_1) determined by executing step 1506 this time and the median (fc_0) which was last determined is referred to as the "shift amount" of the frequency peak. Also, the shift velocity fv1now/s is obtained by calculating (fc_1−fc_0)/(T1−T0). fc_0 has already been retrieved at step 1505 and fc_1 determined at step 1506. Therefore, the learning information selecting unit 260 calculates a difference between the median determined at step 1506 and the median retrieved from the GW learning information management table 1600 at step 1505 and divides the value of the difference by (T1−T0), thus obtaining fv1now/s. After the shift velocity fv1now/s is obtained, the learning information selecting unit 260 registers the obtained shift velocity into the column of the current value of shift velocity 1607 in the GW learning information management table 1600.

At step 1509, the learning information selecting unit 260 obtains new lower limit and upper limit values at time instant T1, using the lower limit, upper limit, and median retrieved from the GW learning information management table 1600 at step 1505 and the median obtained by executing step 1506 this time (at time T1). In particular, the learning information selecting unit 260 obtains new lower limit and upper limit values by executing the following calculation.

f1_1 and f2_1 are taken to denote a lower limit and an upper limit which are newly obtained at step 1509, respectively. Also, the lower limit and the upper limit which were obtained through the last execution of the processing are taken to denote f1_0 and f2_0, respectively. The learning information selecting unit 260 calculates f1_1 and f2_1 by evaluating equations below:

$$f1\_1 = f1\_0 + (fc\_1 - fc\_0)$$

$$f2\_1 = f2\_0 + (fc\_1 - fc\_0)$$

That is, the learning information selecting unit 260 updates the lower limit and the upper limit by adding the shift amount obtained this time to the lower limit (f1_0) and the upper limit (f2_0) which are stored in the GW learning information management table 1600, respectively.

The new lower limit and upper limit obtained at step 1509 and the new median obtained at step 1506 are registered into the lower limit 1604, upper limit 1605, and median 1603 columns, respectively, in the GW learning information management table 1600.

Additionally, if "transmit" is stored in the sensor data transmission 1611 column, the learning information selecting unit 260 transmits the sensor data accumulated at step 1507 to the central facility server 1 at step 1509. Conversely, if "not transmit" is stored in the sensor data transmission 1611 column, transmission of the sensor data is not performed here.

At step 15010, the learning information selecting unit 260 compares an absolute value of the shift velocity fv1now/s obtained at step 1508 with an absolute value of the shift velocity 1606 (which is termed "fv1/s") preset in the GW learning information management table 1600. When the absolute value of fv1now/s is equal to or less than the absolute value of fv1/s, a transition is made to step 1503. When the absolute value of fv1now/s has exceeded the absolute value of fv1/s, the learning information selecting unit 260 transmits information that the shift velocity has become equal to or more than a threshold to the central facility server 1 (step 1511) and a transition is made to step 1501.

As described previously, the shift velocity 1606 set in the GW learning information management table 1600 is the shift velocity of a fault model which has been selected at the central facility server 1, that is, the shift velocity of a waveform obtained from a machine in which failure has occurred actually or a machine in which failure is likely to occur. In a case where the absolute value of the shift velocity obtained at step 1508 has become larger than the absolute value of the shift velocity of a waveform obtained from a machine in which failure has occurred actually (or a machine in which failure is likely to occur), it is supposed to be a predictor of failure occurrence. Hence, the learning information selecting unit 260 pertaining to the present embodiment carries out a determination as in step 1510.

In addition, because the learning information selecting unit 260 performs the processing according to the above-described procedure, information that is used when the gateway 2 performs failure detection is only information that falls within a sensing range to which information resulting from frequency analysis of sensor data has been narrowed down. This enables it to prevent increasing in processing cost and storage cost.

The sensing range required for failure detection differs depending on the type and installation conditions of machinery and equipment which are objects of diagnosis. The data collection system pertaining to the present embodiment determines the sensing range by comparing the sensor data collected from the sensor 5 with plural fault models, as illustrated in FIG. 5. Therefore, it is possible to appropriately narrow down information that is used for failure detection.

A concrete example of the processing that is carried out through the steps 1505 to 1509 is described using FIGS. 16 to 18. In the following, an example in which the earning information selecting unit 260 performs the processing with regard to the sensor #1.

FIG. 16 represents a state of the GW learning information management table immediately after learning information about sensor #1 transmitted from the central facility server 1 has been set in the table. A GW learning information management table depicted in FIG. 17 represents a state immediately after the learning information selecting unit 260 has executed the steps 1505 to 1509, based on the GW learning information management table in FIG. 16. A GW learning information management table depicted in FIG. 18 represents a state immediately after the learning information selecting unit 260 has executed the steps 1505 to 1509, based on the GW learning information management table in FIG. 17. Although all of FIGS. 16 to 18 represent the contents of the GW learning information management table, reference numerals 1600, 1700, 1800 are used to refer to the GW learning information management tables, respectively, in FIGS. 16 to 18, for the sake of avoiding complication of description. Also, reference numerals 1701 to 1711 are used to refer to each of the columns of the GW learning information management table 1700 in FIG. 17 and reference numerals 1801 to 1811 are used to refer to each of the columns of the GW learning information management table 1800 in FIG. 18.

In the following, descriptions are given, assuming that the steps 1505 to 1509 are executed at intervals of one second for the sake of simplifying description. Also, in the following description, a case is described where determination at step 1510 is always NO (fv1now/s is less than the shift velocity specified from the central facility server 1).

After learning information about sensor #1 transmitted from the central facility server 1 is set in the GW learning information management table 1600, the processing that is performed by the learning information selecting unit 260 is outlined as below.

Learning information about sensor #1 is transmitted from the central facility server 1 to the gateway 2, once the setting for the sensor #1 in the learning operating state 1602 column has changed to "operating", step 1503 is executed. T is taken to denote a time instant upon the execution of this step. The learning information selecting unit 260 receives sensor data for one second at step 1503 and performs frequency analysis at step 1504 (that is, a time instant when step 1504 has terminated is (T+1)). Then, at the time instant (T+1), the steps 1505 to 1509 are executed and the contents of the GW learning information management table 1600 are changed to the state of the table in FIG. 17.

After that, the learning information selecting unit 260 receives sensor data for one second again and performs frequency analysis (steps 1503 and 1504). Then, at a time instant (T+2), the learning information selecting unit 260 executes the steps 1505 to 1509, which causes the state of the GW learning information management table 1700 to change to the table state in FIG. 18.

The change of the state of the GW learning information management table 1600 upon the execution of the steps 1505 to 1509 at time (T+1) is described with reference to FIGS. 16 and 17. By the execution of step 1505, the median 1603 (10 kHz), lower limit 1604 (8 kHz), upper limit 1605 (12 kHz), and shift velocity (fv1/s) with regard to the sensor #1 are retrieved from the GW learning information management table 1600 in FIG. 16 (that is, the lower limit, upper limit, shift velocity values transmitted from the central facility server are retrieved).

In consequence, at steps 1506 and 1507, data only in a range from 8 kHz to 12 kHz within the result of frequency analysis obtained at step 1504 is extracted and accumulated into the sensor data accumulating unit 270. Now, in the following description, a median determined as a result of step 1506 executed here is assumed to be 9.9 kHz.

Here, when step 1508 is executed, the shift velocity (fv1now/s) is calculated as below:

$$(9.9-10) \div 1 = -0.1 \text{ kHz } (=-100 \text{ Hz})$$

Following that, at step 1509, the earning information selecting unit 260 calculates a lower limit (f1_1) and an upper limit (f2_1). The lower limit is calculated as below:

$$f1\_1 = 8 + (9.9-10) = 7.9$$

And, the upper limit is calculated as below:

$$f2\_1 = 12 + (9.9-10) = 11.9$$

In consequence, the median, lower limit, and upper limit with regard to the sensor #1 in the GW learning information management table 1600 are changed to those in the corresponding cells of the columns 1703 to 1705 in FIG. 17.

Then, the change of the state of the GW learning information management table 1700 (FIG. 17) upon the execution of the steps 1505 to 1509 at time (T+2) is described with reference to FIGS. 17 and 18. By the execution of step 1505, the median 1603 (9.9 kHz), lower limit 1604 (7.8 kHz), upper limit 1605 (11.9 kHz), and shift velocity (fv1/s) with regard to the sensor #1 are retrieved from the GW learning information management table 1700 in FIG. 17. In consequence, at steps 1506 and 1507, data only in a range from 7.8 kHz to 11.9 kHz within the result of frequency analysis obtained at step 1504 is extracted and accumulated into the sensor data accumulating unit 270. Now, in the following description, a median determined at step 1506 is assumed to be 9.7 kHz.

Here, when step 1508 is executed, the shift velocity (fv1now/s) is calculated as below:

$$(9.7-9.9) \div 1 = -0.2 \text{ kHz } (=-200 \text{ Hz})$$

Following that, at step 1509, the earning information selecting unit 260 calculates a lower limit (f1_1) and an upper limit (f2_1). The lower limit is calculated as below:

$$f1\_1 = 7.8 + (9.7-9.9) = 7.6$$

And, the upper limit is calculated as below:

$$f2\_1 = 11.9 + (9.7-9.9) = 11.7$$

In consequence, the median, lower limit, and upper limit with regard to the sensor #1 in the GW learning information management table 1700 are changed to those in the corresponding cells of the columns 1803 to 1805 in FIG. 18.

As described above, when the processing of FIG. 15 is executed for the first time, the learning information selecting unit 260 extracts data in the frequency range (sensing range) that is specified by the learning information (lower limit and upper limit) transmitted from the central facility server 1 from the waveform of the sensor data and failure detection of the machine 9 that is a monitored object is performed based on the extracted data. However, the learning information selecting unit 260 modifies the sensing range based on the result of analysis of the sensor data (step 1509) and, therefore, the learning information selecting unit 260 is to extract data in the modified sensing range for the second time and subsequently.

For the machine 9 that is a monitored object, its vibration frequency gradually changes, affected by aging among others. For example, the median tends to gradually decrease, as in the example described above. If the learning information selecting unit 260 only extracts data in the sensing range transmitted from the central facility server 1 every time and carries out a determination for abnormality detection from the extracted data, it may become impossible to capture characteristic information (median) to be detected. Hence, the data collection system pertaining to the present embodiment carries out modifying the sensing range based on the result of analysis of sensor data (in particular, the amount of median change), thereby preventing the system from becoming impossible to capture necessary information for abnormality detection.

Finally, a description is given of an overall processing flow that is performed in the data collection system pertaining to the present embodiment. FIG. 20 is a diagram representing the processing flows of the learning information altering unit 120 of the central facility server 1 and the learning information selecting unit 260 of the gateway 2 and information that is transferred between both in the course of processing.

Now, because the processing flows have been detailed, as described hereinbefore with regard to FIG. 5 and FIG. 15, an aspect of transmitting/receiving of data between the central facility server 1 and the gateway 2 is only described with regard to FIG. 20.

The gateway 2 transmits sensor data received from the sensor to the central facility server 1 (2301). This processing step corresponds to step 1501 in FIG. 15.

On the other hand, the central facility server 1 carries out a learning step to determine a frequency range of sensor data which is used for abnormality detection, as described with FIG. 5. The central facility server 1 first receives sensor data from the gateway 2 until the learning end time has been reached and performs comparison with fault models (2302 to 2304). These processing steps correspond to steps 501 to 504 in FIG. 5.

Upon the learning end time, the central facility server 1 creates learning information (2304) and transmits the learning information to the gateway (2306). These processing steps correspond to steps 505 to 509 in FIG. 5.

When the learning information is transmitted to the gateway 2, the gateway transits into the learning operating state and carries out a step of detecting an abnormality of the machine 9 using the sensor data and learning information. As described with FIG. 15 (steps 1503 to 1509), the gateway 2 analyzes the sensor data acquired from the sensor 5, obtains the shift velocity of a median, and determines if the obtained shift velocity of the median is equal to or more than the shift velocity included in the learning information (2311, 2312).

When it has been determined that the shift velocity is excessive (2312, YES), the gateway 2 sends notification data including information that the shift velocity is excessive to the central facility server 1 (2313).

When having received the notification that the shift velocity has become equal to or more than a threshold from the gateway 2, the central facility server lit notifies a maintenance worker or the like of an abnormality of the machine 9 via a screen of the central supervisory terminal 64 (2309). In particular, the central facility server 1 displays, e.g., an alert message that an abnormality has occurred in the machine 9 on the screen, thus notifying the maintenance worker or the like of the abnormality of the machine 9.

LIST OF REFERENCE SIGNS

1 Central facility server
2 Gateway
5 Sensor
70 WAN
300 Learning information altering program
400 Learning information selecting program

The invention claimed is:

1. A data collection system that collects time-series data which is output from sensors installed on equipment which is a monitored object, the data collection system comprising:
a memory;
an input/output device; and
a processor communicatively connected to the memory and the input/output device, wherein the processor is configured to
store, via the memory, a plurality of fault models as data for comparison with the time-series data,
determines a range to examine within the time-series data by comparing the time-series data with each one of the fault models,
perform frequency analysis of the time-series data and generates a frequency spectrum,
extract a partial frequency spectrum to examine from the frequency spectrum generated, using information on a range to examine within the time-series data, and carry out detecting an abnormality of the equipment using the partial frequency spectrum to examine,
compare the frequency spectrum of the time-series data with the frequency spectrum of each one of the fault models and determines one of the fault models having a highest ratio of similarity to the frequency spectrum of the time-series data as a resemblance fault model, and
sends a lower limit and an upper limit of the resemblance fault model being included in the information on the range to examine within the time-series data to an other processor, and
wherein a median which is a frequency at which signal intensity becomes maximum in the frequency spectrum of each one of the fault models, a lower limit which is a smallest one of frequencies at which signal intensity has a minimum value in the frequency spectrum of each one of the fault models, an upper limit which is a largest one of the frequencies at which signal intensity has a minimum value in the frequency spectrum of each one of the fault models are stored in association with each one of the fault models.

2. The data collection system according to claim 1, wherein the other processor determines a frequency range that is specified by the lower limit and the upper limit of the resemblance fault model as an initial value of the frequency range to examine and repeatedly executes:
a) a step of extracting the partial frequency spectrum falling within the frequency range to examine from the frequency spectrum generated, whenever the frequency spectrum is generated;
b) a step of determining a median of signal intensity in the extracted frequency spectrum;
c) a step of calculating shift amount and shift velocity of the median, using the median determined by the step b) and the median last determined by the other processor; and
d) a step of updating the lower limit and the upper limit of the frequency range to examine by adding the shift amount of the median to the lower limit and the upper limit of the frequency range to examine.

3. The data collection system according to claim 2, wherein, as a result of execution of the step c),
e), if the shift velocity of the median has exceeded a predetermined threshold, the system outputs an alert message that an abnormality has occurred in the equipment.

4. The data collection system according to claim 2, comprising:
a server including the memory, the input/output device and the processor; and
a gateway device including the other processor, wherein the gateway device is connected to the server via a first network and connected with the sensors via a second network, and wherein the gateway device includes an other input/output device which receives the time-series data from the sensors and transmits the time-series data to the server.

5. A gateway device that is deployed between sensors installed on equipment which is a monitored object and a server collecting time-series data which is output from the sensors, the gateway device comprising:

a memory;

an input/output device; and a processor communicatively connected to the memory and the input/output device, wherein the processor is configured to receive the time-series data from the sensors;

transmit the time-series data to the server;

perform frequency analysis of the time-series data and generates a frequency spectrum;

receive information on a range to examine within the time-series data; and extract a partial frequency spectrum to examine from the frequency spectrum generated, using information on a range to examine within the time-series data, and carry out detecting an abnormality of the equipment using the partial frequency spectrum to examine, determine a frequency range that is specified by a lower limit and an upper limit included in the information on a range to examine within the time-series data as an initial value of the frequency range to examine and repeatedly executes:

a) a step of extracting the partial frequency spectrum falling within the frequency range to examine from the frequency spectrum generated, whenever the frequency spectrum is generated, b) a step of determining a median of signal intensity in the extracted frequency spectrum, c) a step of calculating shift amount and shift velocity of the median, using the median determined by the step b) and the median last determined, and d) a step of updating the lower limit and the upper limit of the frequency range to examine by adding the shift amount of the median to the lower limit and the upper limit of the frequency range to examine, and wherein information on a range to examine within the time-series data includes a lower limit and an upper limit of frequency.

6. The gateway device according to claim 5, wherein, as a result of execution of the step c), e), if the shift velocity of the median has exceeded a predetermined threshold, the gateway device notifies the server that an abnormality has occurred in the equipment.

7. An abnormality detection method in a data collection system, the method comprising:

a gateway device which receives time-series data which is output from sensors installed on equipment which is a monitored object, and a server which is connected with the gateway device via a network and has a plurality of fault models stored therein as data for comparison with the time-series data, wherein the server executes a learning process which determines a range to examine within the time-series data by comparing the time-series data with each one of the fault models; and the gateway device executes an abnormality detection process which extracts a partial frequency spectrum to examine from a frequency spectrum of the time-series data, using information on the range to examine within the time-series data, determined by the learning process, and carries out detecting an abnormality of the equipment using the extracted frequency spectrum, wherein the server retains a median which is a frequency at which signal intensity becomes maximum in the frequency spectrum of each one of the fault models, a lower limit which is a smallest one of frequencies at which signal intensity has a minimum value in the frequency spectrum of each one of the fault models, an upper limit which is a largest one of the frequencies at which signal intensity has a minimum value in the frequency spectrum of each one of the fault models in association with each one of the fault models, and in the learning process, the server:

compares the frequency spectrum of the time-series data with the frequency spectrum of each one of the fault models and determines one of the fault models having a highest ratio of similarity to the frequency spectrum of the time-series data as a resemblance fault model; and sends the lower limit and the upper limit of the resemblance fault model being included in the information on the range to examine within the time-series data to the gateway device.

8. The abnormality detection method according to claim 7, wherein in the abnormality detection process, the gateway device determines a frequency range that is specified by the lower limit and the upper limit of the resemblance fault model sent from the server as an initial value of the frequency range to examine and, after that, repeatedly executes:

a) a step of extracting the partial frequency spectrum falling within the frequency range to examine from the frequency spectrum of the time-series data;

b) a step of determining a median of signal intensity in the extracted frequency spectrum;

c) a step of calculating shift amount and shift velocity of the median, using the median determined by the step b) and the median last determined by the abnormality detection process;

d) a step of updating the lower limit and the upper limit of the frequency range to examine by adding the shift amount of the median to the lower limit and the upper limit of the frequency range to examine, the abnormality detection process including these steps.

9. The abnormality detection process according to claim 8, further comprising e) a step of outputting an alert message that an abnormality has occurred in the equipment, if the shift velocity of the median obtained by the step c) has exceeded a predetermined threshold.

* * * * *